United States Patent
Chatelet et al.

(10) Patent No.: US 10,738,589 B2
(45) Date of Patent: Aug. 11, 2020

(54) SYSTEM AND METHOD FOR MONITORING THE PERFORMANCES OF A CABLE CARRYING A DOWNHOLE ASSEMBLY

(71) Applicant: Schlumberger Technology Corporation, Sugar Land, TX (US)

(72) Inventors: Vincent Chatelet, Roissy-en-France (FR); Jean-Louis Pessin, Clamart (FR); François Chevillard, Abbeville (FR)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 16/152,515

(22) Filed: Oct. 5, 2018

(65) Prior Publication Data
US 2019/0032469 A1 Jan. 31, 2019

Related U.S. Application Data

(63) Continuation-in-part of application No. 15/161,651, filed on May 23, 2016.

(51) Int. Cl.
*E21B 47/00* (2012.01)
*G01R 31/08* (2020.01)
(Continued)

(52) U.S. Cl.
CPC ............ *E21B 47/00* (2013.01); *E21B 17/003* (2013.01); *E21B 23/14* (2013.01); *E21B 33/08* (2013.01);
(Continued)

(58) Field of Classification Search
CPC ........ E21B 47/00; E21B 17/003; E21B 19/00; E21B 37/00; E21B 41/02; E21B 17/028;
(Continued)

(56) References Cited

U.S. PATENT DOCUMENTS 3,391,443 A 7/1968 Bus et al.
3,699,436 A 10/1972 Shigematsu et al.
(Continued)

FOREIGN PATENT DOCUMENTS

WO 2012052764 A1 4/2012
WO 2013098280 A2 7/2013

OTHER PUBLICATIONS

Extended European Search Report issued in the related EP Application 15290142.7, dated Dec. 23, 2015 (5 pages).
(Continued)

*Primary Examiner* — Regis J Betsch
*Assistant Examiner* — Kaleria Knox

(57) ABSTRACT

The disclosure relates to a method for monitoring the performances of a cable for carrying a downhole assembly in a wellbore, the cable comprising at least a conductive core and an insulating outer layer, comprising:
- measuring a downlink telemetry signal, transmitted from a surface control module to the downhole assembly, and/or an uplink telemetry signal, transmitted from the downhole assembly to the surface control module;
- representing the downlink and/or uplink telemetry signals as a function of a parameter representative of a depth of the downhole assembly,
- analyzing a variation of the telemetry signal as a function of the parameter in view of an electrical model of an installation including the cable and the downhole assembly disposed in the wellbore,
- determining location of anomalies of the cable based on the analysis.

16 Claims, 11 Drawing Sheets

(51) Int. Cl.
*E21B 17/00* (2006.01)
*E21B 33/08* (2006.01)
*E21B 47/12* (2012.01)
*E21B 23/14* (2006.01)
*E21B 19/00* (2006.01)

(52) U.S. Cl.
CPC ............ *E21B 47/12* (2013.01); *E21B 47/121* (2013.01); *G01R 31/083* (2013.01); *E21B 19/00* (2013.01)

(58) Field of Classification Search
CPC ....... E21B 21/08; E21B 19/22; G01R 31/083; G01R 31/088; G01V 11/002; G01V 3/28
See application file for complete search history.

(56) References Cited

U.S. PATENT DOCUMENTS

| | | | |
|---|---|---|---|
| 3,727,128 A | 4/1973 | McFerrin | |
| 5,495,547 A | 2/1996 | Rafie et al. | |
| 6,114,857 A * | 9/2000 | Kohl | E21B 41/02 324/534 |
| 7,254,511 B2 * | 8/2007 | Niedzwiecki | G01R 27/04 324/601 |
| 7,588,080 B2 | 9/2009 | McCoy | |
| 7,652,592 B2 | 1/2010 | Le Briere et al. | |
| 2005/0046591 A1 * | 3/2005 | Pacault | E21B 17/028 340/855.2 |
| 2005/0083209 A1 * | 4/2005 | Miyamae | G01V 11/002 340/854.9 |
| 2007/0113640 A1 * | 5/2007 | De Jesus | E21B 19/22 73/158 |
| 2007/0124093 A1 * | 5/2007 | Choi | G01R 31/088 702/59 |
| 2007/0126422 A1 * | 6/2007 | Crouch | G01N 27/9006 324/240 |
| 2007/0151055 A1 | 7/2007 | Chee et al. | |
| 2007/0204686 A1 | 9/2007 | Solis | |
| 2007/0251326 A1 | 11/2007 | Mathis | |
| 2007/0285274 A1 * | 12/2007 | Esmersoy | E21B 21/08 340/853.5 |
| 2009/0308600 A1 | 12/2009 | Hsu et al. | |
| 2010/0134113 A1 | 6/2010 | DePavia et al. | |
| 2011/0107834 A1 * | 5/2011 | Howard | E21B 17/028 73/431 |
| 2012/0125077 A1 * | 5/2012 | Rodney | E21B 47/022 73/1.37 |
| 2013/0141100 A1 * | 6/2013 | Labib | G01R 31/083 324/333 |
| 2013/0184995 A1 | 7/2013 | Sinclair et al. | |
| 2014/0032116 A1 * | 1/2014 | Guner | G01V 3/28 702/6 |
| 2014/0060844 A1 * | 3/2014 | Barbour | E21B 37/00 166/311 |
| 2014/0232069 A1 | 8/2014 | Jacobs | |
| 2016/0024908 A1 * | 1/2016 | Wu | G01V 3/28 702/9 |
| 2016/0025945 A1 | 1/2016 | Wanjau et al. | |
| 2016/0349302 A1 | 12/2016 | Chevillard et al. | |

OTHER PUBLICATIONS

Office Action received in the related U.S. Appl. No. 15/161,651, dated Apr. 24, 2019 (19 pages).
Office Action received in the related U.S. Appl. No. 15/161,651, dated Nov. 15, 2019 (22 pages).

* cited by examiner

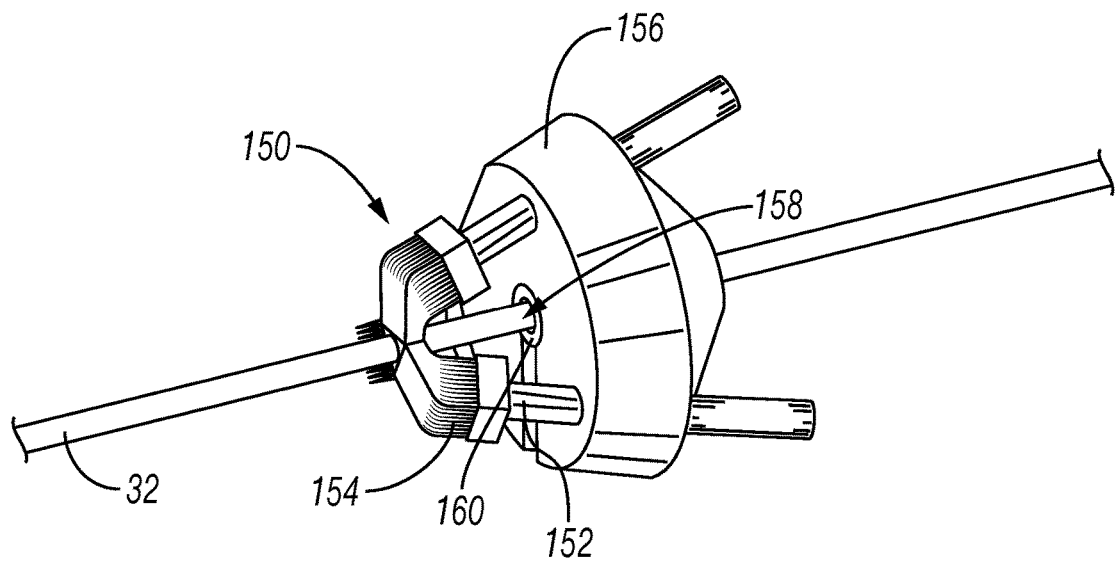
FIG. 2B
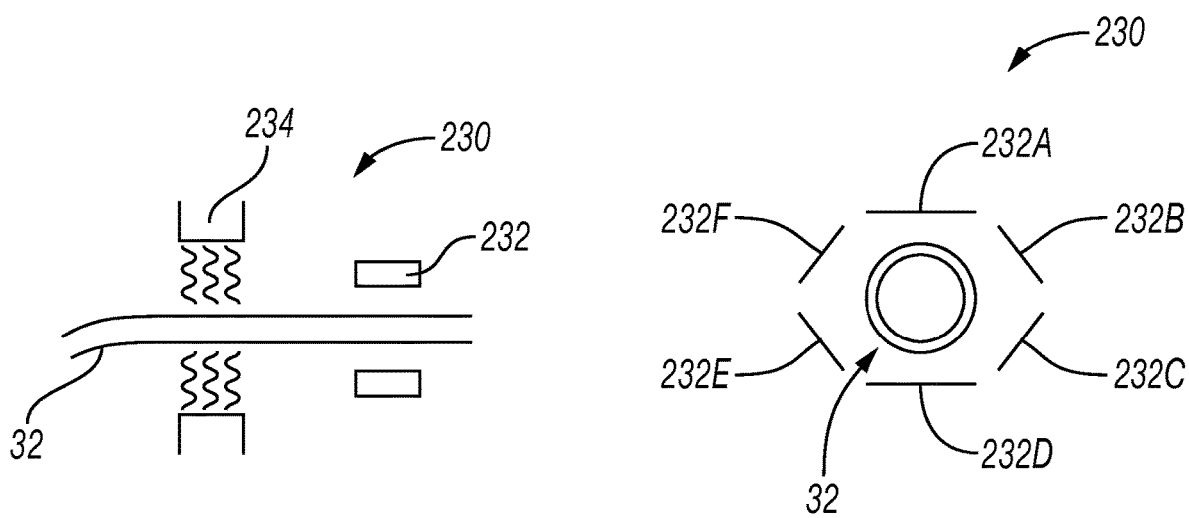
FIG. 5B  FIG. 5C

SYSTEM AND METHOD FOR MONITORING THE PERFORMANCES OF A CABLE CARRYING A DOWNHOLE ASSEMBLY

BACKGROUND

The disclosure relates to a method for monitoring the performances of a cable comprising at least a conductive core and an insulating outer layer for carrying a downhole assembly in a wellbore. Such cables are generally called digital slicklines and enable communication between downhole assembly and surface unit.

Electrical performances of cables such as slickline cables are indeed an interesting parameter to monitor as the communication between the surface and the downhole assembly greatly depends of the electrical integrity of the cable, each current leak on the cable generating a signal loss that may lead to a failure of the operation planned for the cable.

Methods for verifying the electrical performances of cables are already used during the build-up of the cable or, as disclosed in patent application US2013/141100, at the well site.

SUMMARY

The disclosure relates to a method for monitoring the performances of a cable for carrying a downhole assembly in a wellbore, the cable comprising at least a conductive core and an insulating outer layer. The method comprises measuring a downlink telemetry signal, transmitted from a surface control module to the downhole assembly, and/or an uplink telemetry signal, transmitted from the downhole assembly to the surface control module. It also includes representing the downlink and/or uplink telemetry signals as a function of a parameter representative of a depth of the downhole assembly, analyzing a variation of the telemetry signal as a function of the parameter in view of an electrical model of an installation including the cable and the downhole assembly disposed in the wellbore, and determining location of anomalies of the cable based on the analysis.

The disclosure also relates to a system for monitoring the performances of a cable for carrying a downhole assembly in a wellbore and comprising at least a conductive core and an insulating outer layer, the system comprising at least one of a downlink sensor for measuring a downlink telemetry signal at the downhole assembly, and an uplink sensor for measuring an uplink telemetry signal at the surface control module. The downlink telemetry signal is a signal transmitted from a surface control module to the downhole assembly and the uplink telemetry signal is a signal transmitted from the downhole assembly to the surface control module. The system also comprises a processor configured for representing at least one of the downlink and uplink telemetry signals received from the downlink or uplink sensor as a function of a parameter representative of a depth of the downhole assembly (such as depth or time), analyzing a variation of the at least one of the downlink and uplink telemetry signals in view of an electrical model of an installation including the cable and the downhole assembly disposed in the wellbore, and determining a location of one or more anomalies of the cable based on the analysis.

The disclosure also relates to a method for monitoring the performances of a cable for carrying a downhole assembly in a wellbore, the cable having a conductive core and an insulating outer layer. The method comprises performing on the cable a detection operation for detecting the presence of local anomalies on the cable, in particular on its outer layer, generating an electrical model of a configuration of an installation including the cable and the downhole assembly disposed in the wellbore, in function of the detected local anomalies, and estimating a parameter relative to a signal transmitted by the cable between the downhole assembly and a surface equipment in the configuration of the wellbore on the basis of the electrical model.

Such a method gives data in order to predict if a job in different configurations of the wellbore will fail or will succeed. The use of the slickline cable may then be adapted to the performances that the cable is able to deliver.

The disclosure also relates to a system for monitoring the performances of a cable for carrying a downhole assembly in a wellbore and comprising a conductive core and an insulating outer layer. The system comprises a detection apparatus for detecting the presence of local anomalies on the cable and a processor for generating an electrical model of an installation including the cable and the downhole assembly disposed in the wellbore, defined in function of the detected local anomalies, and determining a parameter relative to the signal transmitted by the cable between the downhole assembly and a surface equipment of the installation in the configuration on the basis of the electrical model.

The disclosure also related to a sleeve for spooling a cable around a drum, having an cylindrical shape and configured to be disposed around a spooling surface of the drum, the sleeve comprising at least two independent parts, each of cylindrical shape and having a first portion, comprising at least a peripheral groove to receive the cable, and a second portion situated at one of the longitudinal ends of the part and having a longitudinal attachment edge. The attachment edges are configured so that a longitudinal attachment edge of a first part is of complementary shape of a longitudinal attachment edge of a second part. The attachment edges comprise at least an edge portion, and are each configured so that the total length of the edge portions having a tangent situated in a predetermined plan perpendicular to the axis of the cylinder are less than 20% of the perimeter of the sleeve.

BRIEF DESCRIPTION OF THE DRAWINGS

Various aspects of this disclosure may be better understood upon reading the following detailed description and upon reference to the drawings in which:

FIG. 2B is a perspective view of a variant of the first detection apparatus of FIG. 2.

FIG. 5B is a schematic view of a third detection apparatus according to another embodiment of the disclosure, FIG. 5C is a section view of the third detection apparatus of FIG. 5B.

DETAILED DESCRIPTION

One or more specific embodiments of the present disclosure will be described below. These described embodiments are examples of the presently disclosed techniques. Additionally, in an effort to provide a concise description of these embodiments, some features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would still be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Figure 1:
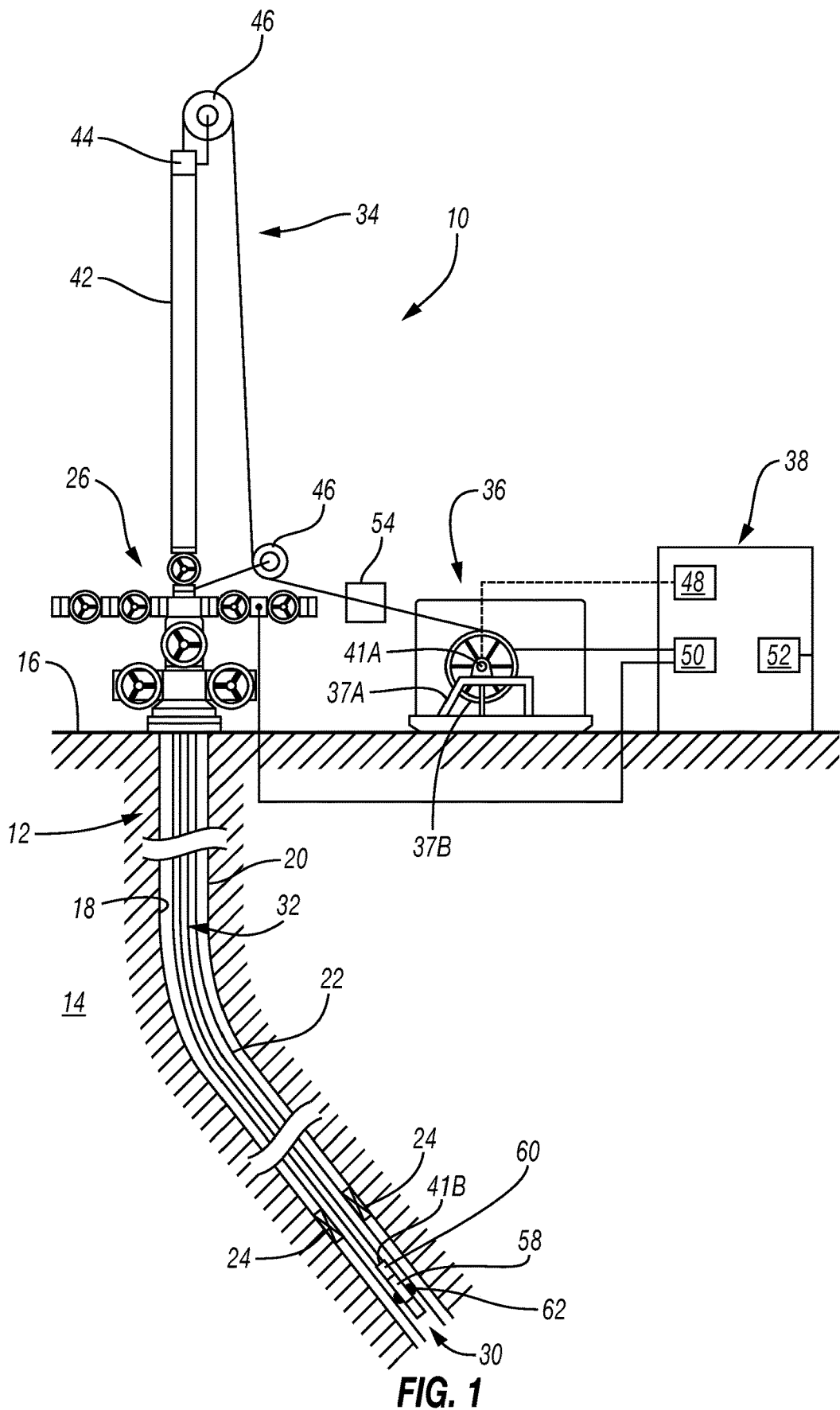
FIG. 1 is a schematic view of a intervention installation, comprising a system according to an embodiment of the disclosure.

An intervention installation 10 according to the disclosure is illustrated in FIG. 1. This installation 10 is intended to perform operations in a fluid production or injection well 12 made in the subsoil 14.

These operations are applied by means of a downhole assembly 30 for carrying out actions and/or perform measurements at the bottom of the well 12, such as perforations, cuttings by means of a torch, cementation operations, jarring operations or further operations for setting tools into place such as setting into place a seal gasket or anchoring of a tool.

These interventions are carried out in any point of the well 12, from the surface 16.

The fluid produced in the well 12 is for example a hydrocarbon such as petroleum or natural gas and/or another effluent, such as steam or water, the well is an "injector" well into which liquid or gas is injected. The production tubing may contain one or several different types of fluid.

The well 12 is made in a cavity 18 positioned between the surface 16 of the ground and the fluid layer to be exploited (not shown) located in depth in a formation of the subsoil 14.

The well 12 generally includes an outer tubular duct 20, designated by the term of "casing", and formed for example by an assembly of tubes applied against the formations of the subsoil 14. The well 12 may also include at least one inner tubular duct 22 with a smaller diameter mounted in the outer tubular duct 20. In certain cases, the well 12 is without any duct 20, 22.

The inner tubular duct 22 is generally designated as "production tubing". It is formed with a metal assembly of metal tubes. It is wedged inside the outer tubular duct 20 for example by linings 24.

The well 12 includes a well head 26 at the surface which selectively closes the outer tubular duct 20 and said or each inner tubular duct 22. The well head 26 includes a plurality of selective access valves inside the outer tubular duct 20 and inside the inner tubular duct 22.

The intervention installation 10 includes an intervention device comprising an intervention and measurement downhole assembly 30 intended to be lowered into the well 12 through the inner tubular duct 22, and a conveying cable 32 for deploying the downhole assembly 30 in the well 12.

The intervention installation 10 further includes a sealing and alignment assembly 34 of the cable 32, mounted on the well head 26, an assembly 36 for deploying the cable 32, positioned in the vicinity of the well head 26, and a surface control unit 38.

The sealing and alignment assembly 34 comprises an airlock 42 mounted on the well head 26, a stuffing box 44 for achieving the seal around the cable 32 and return pulleys 46 respectively attached on the stuffing box 44 and on the well head 26 in order to send back the cable 32 towards the deployment assembly 36.

The airlock 42 is intended to allow introduction of the downhole assembly 30 into the well 12.

The stuffing box 44 is capable of achieving a seal around the smooth outer surface of the cable 32, for example via annular linings applied around this surface or/and by injecting a fluid between the outer surface and the wall of the stuffing box 44.

In a so-called "open well" or "open hole" alternative, in which there is no casing 20, the assembly 34 is exclusively an assembly for aligning the cable, without any sealing device.

The deployment assembly 36 includes a winch 37A provided with a drum 37B. The winch 37A and its drum 37B are laid on the ground or are optionally loaded onboard a vehicle (not shown). A spooling sleeve may be fitted around the drum 37B, as will be described in reference to FIGS. 9 to 13. The winch 37A is capable of winding or unwinding a given length of cable 32 for controlling the displacement of the downhole assembly 30 in the well 12 when moving up or down respectively. An upper end 41A of the cable may be attached onto the drum 37B.

The surface control unit 38 comprises a processor unit 48 and a first telemetry unit 50 for communicating with devices situated at the well site, for instance the winder 37B and the downhole assembly 30, and a second telemetry unit 52 for communication with computers remote from the well site.

The intervention installation further comprises a detection apparatus 54 for detecting the presence of at least a local anomaly on the cable. The detection apparatus, as the winch or other devices of the wellsite, is connected to the surface control unit 38, via the first telemetry unit 50. Embodiments of the detection apparatus will be described in more detail in reference to FIGS. 2 and 5.

The downhole assembly 30 comprises a hollow case comprising an operating assembly 58 comprising one or several measuring module and tools such as jarring tools or perforating tool, capable of being controlled from the surface by electrical signals transmitted through the cable 32. It also comprises a telemetry module 60 for communicating with the surface control unit 38 via the cable 32. The downhole assembly also comprises contacting elements 62 for contacting with duct 22 in order to enable communication with the downhole assembly. The communication is performed via known method, such as the one disclosed in U.S. Pat. No. 7,652,592 hereby incorporated by reference. In other embodiments, the cable may be connected to the downhole assembly thanks to a capacitive coupling at the head of the well as disclosed in application No WO2013/098280 for instance.

The cable 32 is a cylindrical solid cable having a smooth outer surface 40.

The cable 32 extends between an upper end 41A, attached on the deployment assembly 36 at the surface, in particular on the drum 37B, and a lower end 41B, intended to be introduced into the well 12. The downhole assembly 30 is suspended from the lower end 41B of the cable 32.

The length of the cable 32, taken between the ends 41A, 41B may be greater than 1,000 m and is notably greater than 1,000 m and comprised between 1,000 m and 10,000 m.

The cable 32 has an outer diameter of less than 8 mm, advantageously less than 6 mm.

The cable 32 includes a central metal core, and an insulating outer sheath applied around the central core.

The central core is formed by a single strand of solid metal cable, designated by the term "piano wire" and sometimes by the term of "slickline cable".

The metal material forming the core is for example electroplated or stainless steel. This steel for example comprises the following components in mass percentages:
Carbon: between 0.010% and 0.100%, advantageously equal to 0.050%;
Chromium: between 10% and 30%, advantageously equal to 15%;
Manganese: between 0.5% and 3%, advantageously equal to 1.50%;
Molybdenum: between 1.50% and 4%, advantageously equal to 2%;
Nickel: between 5% and 20%, advantageously equal to 10%;
Phosphorus: less than 0.1%, advantageously less than 0.050%;
Silicon: less than 1% advantageously less than 0.8%;
Sulphur: less than 0.05% advantageously less than 0.03%;
Nitrogen less than 1%, advantageously less than 0.5%.
This steel is for example of the 5R60 type.

The core is solid and homogeneous over the whole of its thickness. It has a smooth outer surface.

The diameter of the core is typically comprised between 1 mm and 5 mm, advantageously between 2 mm and 4 mm, and is for example equal to 3.17 mm, i.e. 0.125 inches.

The core has a breaking strength of more than 300 daN, and notably comprised between 300 daN and 3,000 daN, advantageously between 600 daN and 2,000 daN.

The core further has a relatively high electrical linear resistance of more than 30 mohms/m, and for example comprised between 50 mohms/m and 150 mohms/m.

The core has sufficient flexibility so as to be wound without any substantial plastic deformation on a drum with a diameter of less than 0.8 m.

The outer sheath or outer insulation layer forms an annular sleeve applied on the core, over the whole periphery of the core, on substantially the whole length of the cable 32, for example on a length of more than 90% of the length of the cable 32, taken between its ends 41A, 41B.

The outer sheath thus has a cylindrical inner surface applied against the central core and a smooth outer surface delimiting the smooth outer surface of the cable 32.

The thickness of the sheath is advantageously comprised between 0.2 mm and 2 mm.

The outer sheath includes a polymer matrix.

The matrix is made on the basis of a polymer such as a fluoropolymer of the fluorinated ethylene propylene type (FEP), perfluoroalkoxyalkane, polytetrafluoroethylene (PTFE), perfluoromethylvinylether, or on the basis of a polyketone such as polyetheretherketone (PEEK) or polyetherketone (PEK), or on the basis of epoxy, optionally taken as a mixture with a fluoropolymer, or further based on polyphenylene sulfite polymer (PPS), or mixtures thereof.

The polymer matrix may be made in polyetheretherketone (PEEK).

The outer sheath optionally comprises mechanical reinforcement fibres embedded in the polymer matrix.

The cable that has been disclosed is a slickline cable but the method and installation of the disclosure could also be applied on other types of cables, such as wireline cables, having several conductive elements forming the conductive core or a cable having several insulating layers with interposition of conductive layers. The installation is not limited either to the one disclosed in FIG. 1.

The quality of the telemetry signals depends directly from the insulation of the conductive core of the cable and then of the mechanical state of the cable and in particular of the outer sheath or insulation layer. It is therefore interesting to be able to detect the anomalies on the cable in order to predict if a signal will be properly transmitted to the downhole assembly and, consequently, if an intervention job will be completed or will fail. The anomalies are mainly cracks and holes in the outer insulation layer of the cable that may lead to current leaks outside of the conductive core.

The manipulation of the cable for preventing it to be damaged is also important for decreasing the number of the anomalies on the cable.

Figure 2:
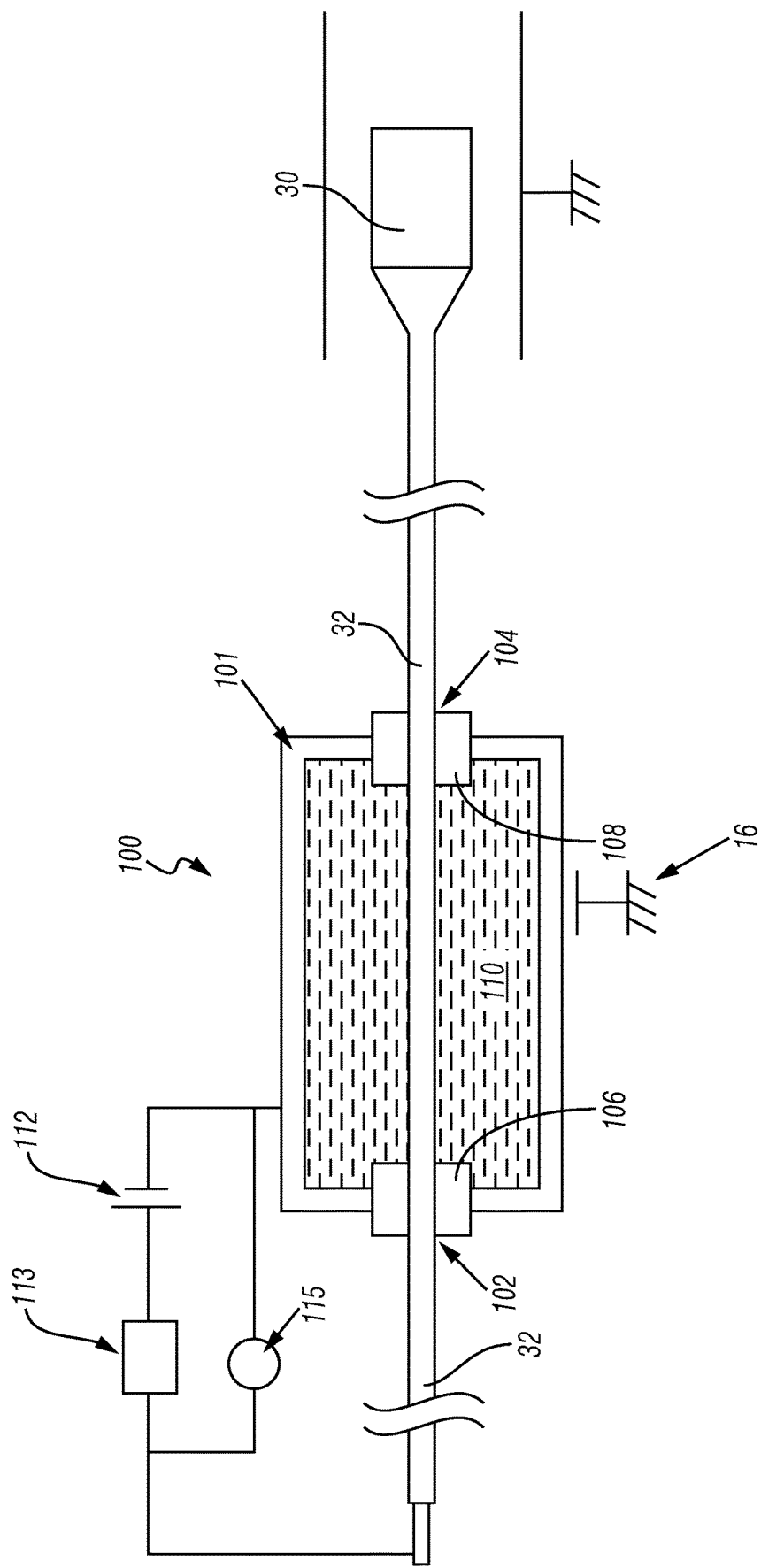
FIG. 2 is a schematic view of a first detection apparatus of a system according to an embodiment of the disclosure.

A first type of detection apparatus 100 is represented on FIG. 2. It comprises a box 101, comprising a first opening 102 forming an inlet for the cable 32 and a second opening 104 forming an outlet for the cable 32. The arrow indicates the circulation direction of the cable even though the detection apparatus functions when the downhole assembly is lowered in the well, ie when the cable circulates in a predetermined direction (unwinding direction), and also when the downhole assembly is removed from the well, ie when the cable circulates in the opposite direction (winding direction).

The detection apparatus 100 further comprises a sealing and insulation element 106, 108 in each opening 102, 104, such as sealing rings, and is filled with conductive medium 110, such as a conductive fluid, for instance water. The sealing and insulating elements surround the cable so as to be interposed between the box 101 and the cable 32. They are made of an electrically insulating material, such as PTFE. They electrically insulate the cable 32 and the box 101 from each other and also prevent leak from the conductive fluid 110 outside of the box 101.

The detection apparatus 100 also comprise a electrical generator 112 connected on one terminal to the box 101 with the interposition of a resistor 113 and on the other terminal to the conductive core of the cable, for instance via the surface unit, in particular via a collector situated at the extremity 41A of the cable 32 attached to the drum 37B. The generator may be a voltage or current generator, and generates an alternative or continuous signal. It applies a predetermined electrical voltage and current to the box or the cable so that a voltage difference is set between the conductive core of the cable and the box. The detection apparatus also comprises a electrical measurement device 115, for instance a voltmeter, for measuring a parameter relative to the box 101, for instance a potential difference between the box 101 and the conductive core of the cable. It may measure other electrical parameter. However, the value of this parameter when the box is empty corresponds to a predetermined value. For instance, on the embodiment of FIG. 2, the measured voltage is between the core of the cable and the box but the measured voltage may be the voltage of the resistor 113.

The box 101 may also be insulated from the ground and the formation 16 so that the events happening around the detection apparatus do not influence the measurement.

The detection may be performed while a signal is transmitted to the downhole assembly as the measurement does not generate perturbations relative to the transmitted signal.

We will describe below how this apparatus detects the anomalies. When the cable passes in the box and that no anomaly is situated in the box, the conductive core is insulated from the outside by the outer sheath. In this case, as no electrical contact happens between the cable 32 and the box 101, the electrical circuit formed between the cable 32 and the box 101 is an open circuit. The electrical parameter then corresponds to the predetermined value.

However, when a portion of cable with an anomaly enters the detection apparatus, the conductive core interacts with the box 101 via the conductive fluid and the electrical circuit closes which leads to the circulation of current in the circuit. The value of the electrical parameter then changes. The magnitude of the anomaly may be measured. Indeed, the bigger the current leak from the cable to the box will be, the greater the change of the electrical parameter will show.

Figure 3:
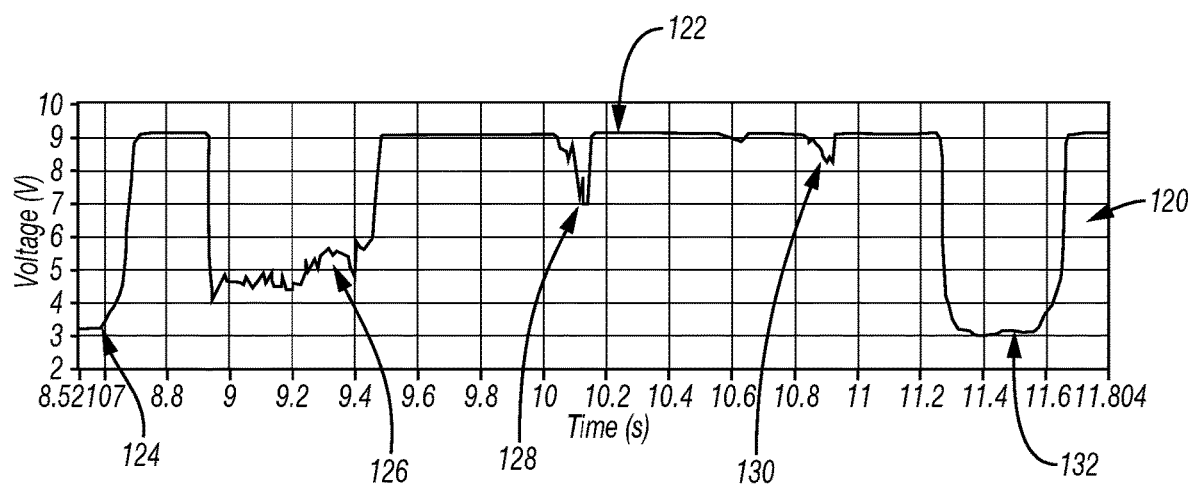
FIG. 3 is a plot showing a signal obtained from the first detection apparatus shown in FIG. 2 when a cable with a conductive core and an outer insulation layer passes in the first detection apparatus.
Figure 4:
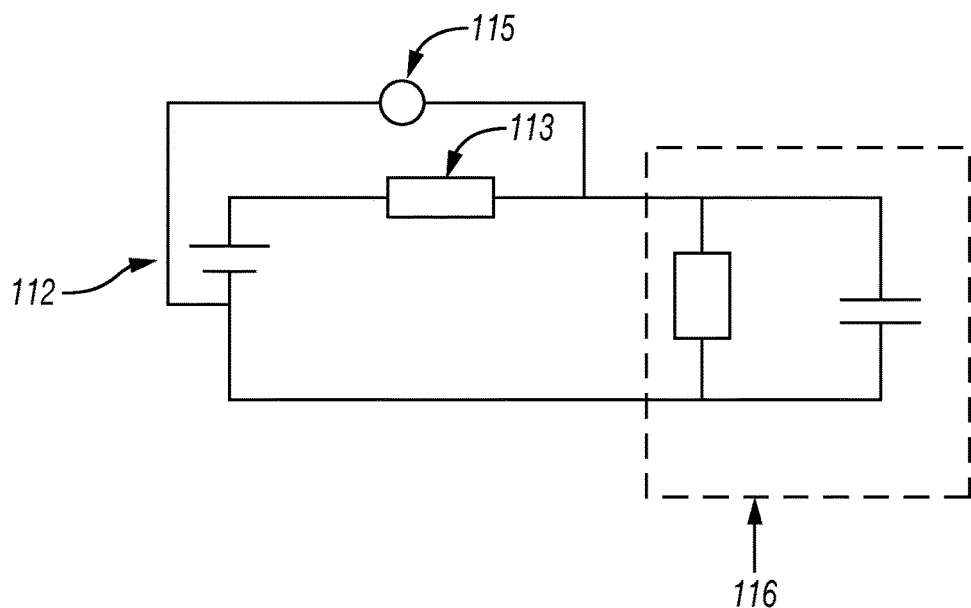
FIG. 4 is an schematic drawing representing an electrical model of the first detection apparatus and the cable when an anomaly in the cable passes in the detection apparatus.

As can be seen on FIG. 3, which is a plot showing a curve 120 of a measured voltage by the electrical measurement device 115 versus time taken while a cable comprising different types of anomalies passes in the box, the measured voltage is set to a default voltage 122 decreases in portion 124, 126, 128, 130, 132 corresponding to when an anomaly passes in the box. The decrease of the measured voltage varies in function of the type of anomaly that passes in the box 101. As already indicated above, other electrical parameters such as current, capacitance, impedance, etc. may be measured and enable to obtain similar results FIG. 4 shows an electrical model of the detection apparatus when an anomaly is in the box. The current leak between the box 101 and the conductive core is modelled as the circuit 116 comprising a capacitor and a resistor in parallel. The measured electrical parameter enables to characterize this circuit 116 and obtain values of the impedance of the resistor and capacitor depending on the magnitude of the anomalies. The values of the impedances of the resistance and capacitor may also be set to a predetermined value that does not take into account the magnitude of the anomaly.

The model of FIG. 4 is a simple model that does not take into account the elements of the installation situated around the detection apparatus. However, a more complex model taking into account the other elements of the installation may be set. One or several filters, such as a low pass filter, may also be provided in the detection apparatus for eliminating undesirable signals that may have an effect on the signal measured by the electrical measurement device 115.

In an alternative to the first detection apparatus, the conductive fluid may be replaced by conductive punctual elements, such as metallic balls. In another variant shown in FIG. 2B, an electrical contact with the cable may be obtained via at least one brush 150 having a metallic pin 152 and having metallic bristles 154 arranged so that the bristles are in contact with the cable when the cable is spooled or unspooled. More specifically, on FIG. 2B, the arrangement comprises three brushes disposed so as to surround the cable and to detect the defects on its whole circumference. They are arranged on a metallic support 156 comprising an aperture 158 for enabling the passage of the cable and integral with the pins 152 of each brush that extend away from the support 156. The pins are tilted so that the bristles 154 situated at the free end of the pin 152 have a contacting zone close to the aperture 158 when projected on the support 156, which enables to perform the contact with the cable. The brush bristles are in flexion on the cable. The support 156 is also provided with an electrically insulating coating 160 at the aperture to guide the cable closely while avoiding any electrical contact with the support at the level of the aperture 158. Regarding the electrical circuit, the support is connected to the same electrical circuit as the box of the apparatus shown on FIG. 2. The defect is detected when there is an electrical contact between the brush and the central core of the cable 32, as previously explained.

This variant may be easily integrated at a low cost and is not dependent from climatic conditions or from the exact properties of the fluid as in the first detection apparatus described in FIG. 2. Of course, the arrangement shown on FIG. 2B is exemplary and any arrangement for maintaining at least one brush in contact with the cable is appropriate.

The first detection apparatus may be situated anywhere between the well head and the winder so as to provide data regarding the anomalies of the cable 32 each time the cable is wound and/or unwound. It may however be situated in a separate testing facility as well.

Figure 5:
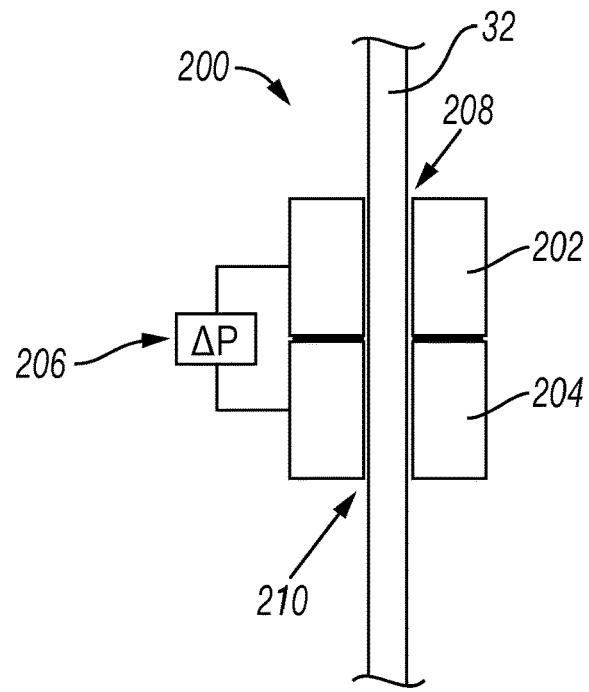
FIG. 5 is a schematic view of a second detection apparatus according to another embodiment of the disclosure.

A second type of detection apparatus 200 is shown on FIG. 5. This detection apparatus 200 comprises two adjacent cylindrical sealing elements 202, 204 made of a deformable material, such as an elastomer. The sealing elements may be packers for instance. The sealing elements 202, 204 are identical. Each of them comprises a central orifice 208, 210 for receiving the cable 32 and is configured to hold tight the cable by deforming if the external shape of the cable changes.

The second detection apparatus also comprises a measuring device 206 for measuring a pressure differential between both sealing elements. The pressure of the sealing element indeed depends on the shape of the cable as the sealing element expands or retracts to match the cable's external shape. When an anomaly passes in one of the sealing element, the pressure of the element decreases as it expands to match the shape of the sealing element. The differential pressure enables to have information on anomalies on the cable, that may be used as part of the second detection apparatus.

The second detection apparatus may include not only two sealing elements but three, four or more sealing elements. Further, it may be situated in the intervention installation, so that the anomalies of the cable 32 are detected every time the cable is wound or unwound, and in particular in the stuffing box 44 which already includes such sealing elements for sealing the well. It may also be situated outside of the intervention installation.

A third type of detection apparatus 230 is shown on FIG. 5B & FIG. 5C. The third detection apparatus 230 comprises at least an infrared sensor 232 for detecting infrared emission of the cable, such as an infrared camera. In particular the third detection apparatus may comprise a plurality of infrared sensors 232A-232F for surrounding the cable 32 in order to detect the defects of the cable on its whole circumference. In the example shown on FIG. 5C, the apparatus comprises six infrared sensors disposed around the zone for the passage of the cable 32 but any number of infrared sensor is appropriate. In order to enhance the detection, the apparatus may also comprise a heater 234, disposed upstream of the infrared sensor.

As the central core of the cable is made of a metallic material while the outer sheath is made with an electrically insulating material, more particularly a plastic material, the central core and the outer sheath have very different thermal conductivities. Therefore, the temperature of the central core and the temperature of the outer sheath are not the same. The temperature difference is increased when the cable has been heated beforehand. Thus, when the cable is damaged and the central core of the cable 32 is apparent, which constitutes a defect, the infrared sensor show a zone having a different color than the outer sheath of the cable. A simple post-processing of the images sent by the sensors enable to detect the defects in the cable 32.

Figure 6:
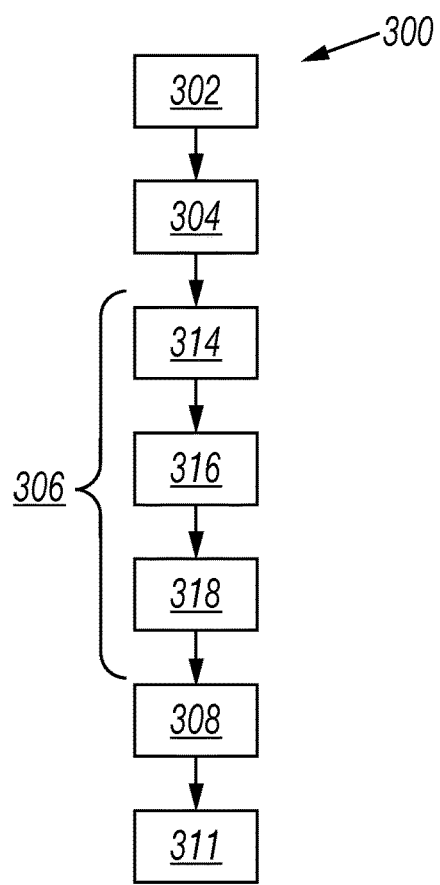
FIG. 6 is a flow diagram of a method for monitoring the performances of the cable according to an embodiment of the disclosure.

The method 300 for monitoring performances of the cable will then be described in more details, in reference to FIG. 6.

In a first stage (at box 302), the anomalies of the cable are detected by the first and/or second detection apparatus or any appropriate detection apparatus and, if applicable, characteristics of an electrical circuit modelling the anomaly are estimated. The detection apparatus communicates with the processor of the surface control module and the surface control module associates (at box 304) each detected anomaly with a position of the anomaly on the cable. This may be performed by associating the data of detection apparatus with time data at the detection apparatus. Surface control unit 38 also communicates with the winder that determines the length of unwound cable at each time. Knowing the installation and the shifting in length between the winder and the detection apparatus, the position of the cable situated in the detection apparatus at a predetermined time may be calculated.

Once the position and optionally magnitudes of the anomalies have been obtained, an electrical model of a configuration of the well is generated (box 306). A configuration of the well is taking into account several parameters of the well, for instance the fluids contained in the well in function of depth. This electrical model may depend on the position and magnitude of the anomalies and also on the fluids that are contained in the well. Once the electrical model is generated a parameter relative to the transmitted signal between the surface control unit 38 and the downhole assembly 30 is determined (at box 308). The transmitted signal may be for instance plotted for each depth at which the downhole assembly 30 is set. The parameter may be the transmitted signal itself or lost signal.

The method may also comprise after obtaining the signal loss, predicting if a job in the predetermined configuration will succeed and, if not, recommending appropriate action for ensuring the job success (at box 311)

Figure 7:
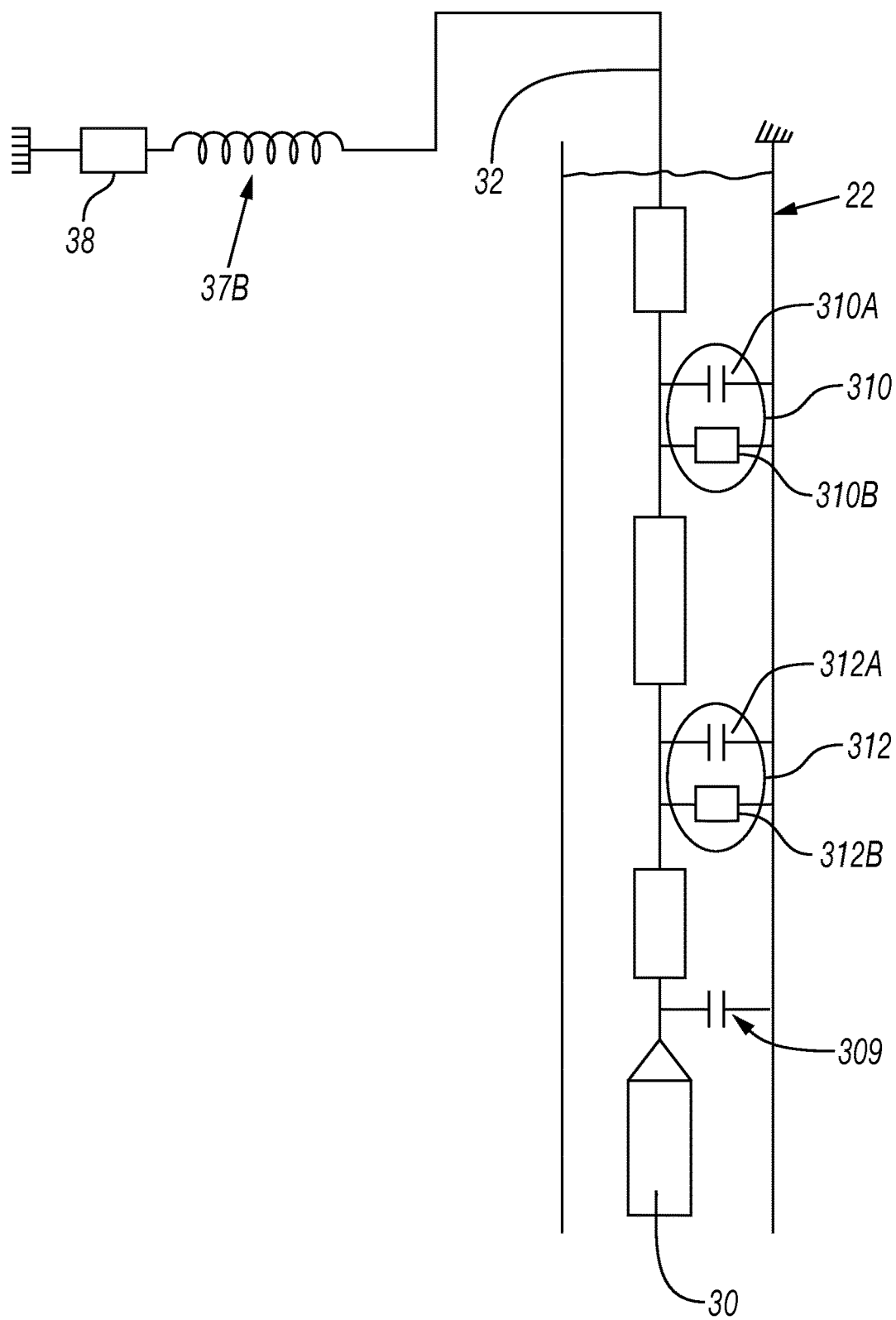
FIG. 7 is a schematic drawing representing an electrical model of the wellbore generated by a method according to an embodiment of the disclosure.

An example of an electrical model is shown on FIG. 7. The drum 37B is modelled by a coil whose inductance is set in function of the length of wound cable around the drum. The core of the cable 32 is modelled as a resistor having a known impedance while the duct 22 and surface unit 38 are modelled as connected to the electrical mass. The electrical connection between the core of the cable and the casing is modelled as a capacitor 309. Further, the anomalies 310, 312 are modelled at their associated position as a circuit comprising a resistor 310B, 312B and a capacitor 310A, 312A in parallel. In the model shown on FIG. 7, only two anomalies have been detected on the cable but of course, the model may comprise as many modelled RC circuits as there is anomalies. The modelling of the anomalies and/or of the installation is not limited to the model set here. Other more or less complex models may be used as well.

The value of the impedance and capacitance of these modelled resistors 310B, 312B and capacitors 310A, 312A may be set at a predetermined value if the detection apparatus is not able to determine the magnitude of the anomaly. Alternatively, it may depend on the magnitude of the anomaly that has been detected. For instance, the value of the impedance and of the capacitance of the modelled circuit match the ones that have been determined with the first detection apparatus.

In another embodiment, the values of the impedance and capacitance of these modelled resistors 310B, 312B and capacitors 310A, 312A may depend on the fluid situated in the wellbore at the position of the anomaly. Indeed, the impedance of the resistor modelling the anomaly will not be identical if the anomaly is situated in water or oil. In this case, the method may comprise determining the fluids in presence in the wellbore at the position of each anomaly (at box 314) and calculating the impedance and capacitance of the modelled resistors 310B, 312B and capacitors 310A, 312A on the basis of the fluid that is situated at this position (at box 316). This may be performed for instance by determining the resistivity of the fluid in the well and determining the resistivity of the fluid in the conductive box and to estimate the value of the impedance of the resistor and the capacitance of the capacitor on the basis of the measured values in the first detection apparatus and of the resistivity of the fluids in the detection apparatus and in the wellbore. Alternatively, if the fluid in the wellbore is not known, the values of the impedance of the resistor and the capacitance of the capacitor may be determined as if the fluid in the wellbore was a very conductive fluid, such as brine or saline water, that would generate greater losses of signals. Once the values has been estimated, the electrical model may be set (at box 318).

For facilitating the determination of the values of the impedance of the resistors 310B, 312B and of the capacitance of the capacitor 310A, 312A, the method may also comprise a calibration of the first detection apparatus. This calibration comprises inserting in the conductive box of the first detection apparatus a predetermined sample of a cable and measuring its associated electrical parameter. This measurement may then be compared to the same measurement made in a reference fluid. A corrective factor may then be determined for the values of the impedance and capacitance as determined in the first detection apparatus compared to the values determined in the reference fluid. This calibration enables to have consistent model regardless of the used conductive fluid in the first detection apparatus. Further, fluids situated in the well may also be solely compared to the reference fluid in this case.

Figure 8:
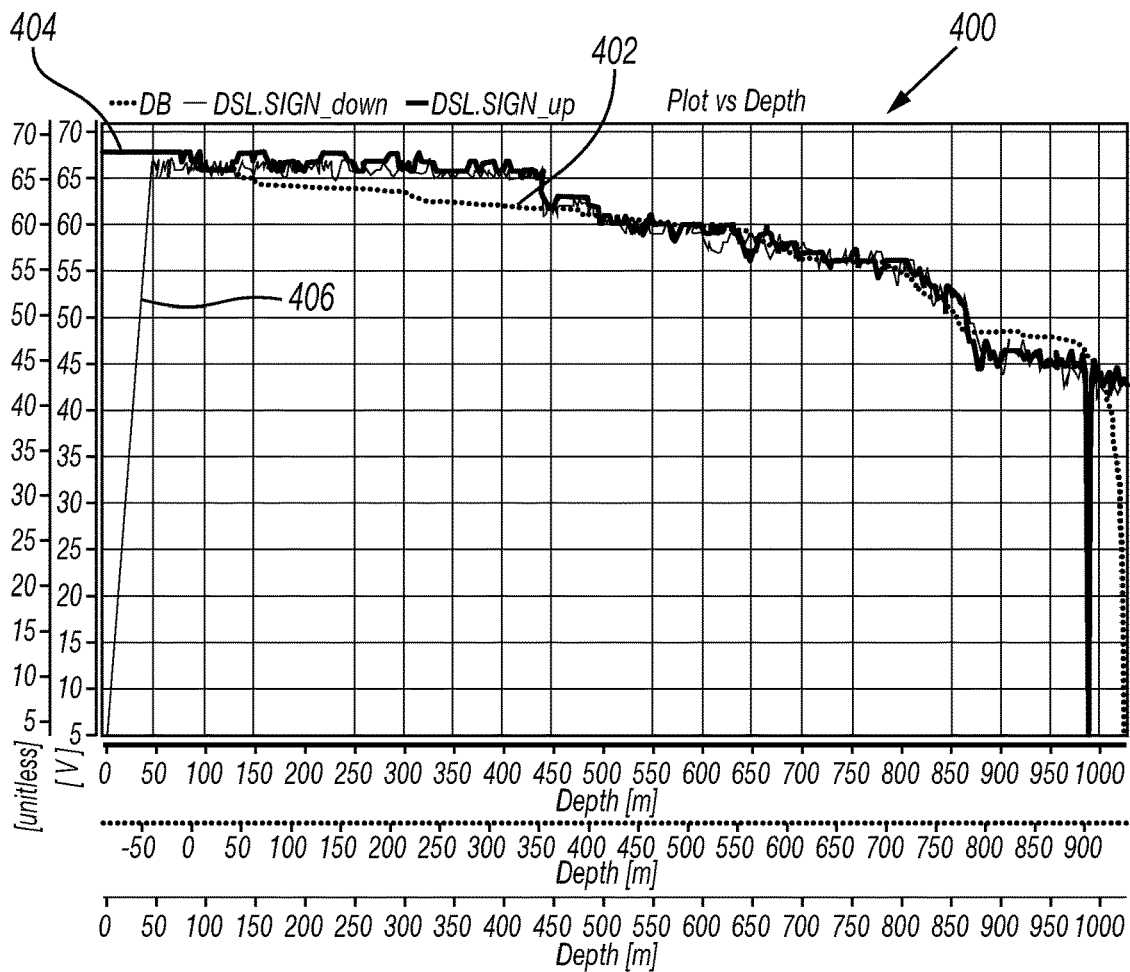
FIG. 8 is a plot showing a prediction of a transmitted signal estimated via the method of FIG. 6 in a predetermined configuration of the installation, versus transmitted signals to and from the surface in said configuration.

FIG. 8 shows a plot 400 of an transmitted signal in function of depth of the downhole assembly estimated thanks to the above-mentioned electrical model (shown on curve 402) for a predetermined cable in a predetermined configuration of the well. The curves 404 and 406 show respectively the telemetry signal up from the downhole assembly to the surface and the telemetry signal down from the surface control module to the downhole assembly that was measured at each depth of the downhole assembly when the predetermined cable was set in the well in the predetermined configuration. It shows the method according to the disclosure is consistent and enables to predict the success or failure of a next job.

The prediction may be based on the comparison of the signal obtained at the depth at which the job is performed with a predetermined threshold value. It will be predicted that the job will fail if the level of the signal is below the threshold. In this case, the recommendation may be to cut the cable at its free end so as to throw away a certain length of cable as the cable that has not been unwound and used is considered as undamaged. An electrical model of installation with the cable cut at its free end may be generated based on the acquired data by the detection apparatus so as to simulate the signal transmitted by such a cable, in order to guarantee an efficient decision-making. Another recommendation may be to change the cable for instance if the remaining length of the cable once the damaged portion at its free end has been removed is inferior to the depth of the job to perform.

The deformation in length of the cable may also be monitored in order to obtain additional data relative to the performances of the cable. This may be performed without any additional device by comparing the position of a detected anomaly on a cable during a first detection operation and the position of the same anomaly during a second detection operation taking place later during the life of the cable. Indeed, if the position of the anomaly has changed relative to a reference position (for instance the end 41B of the cable), it shows that the cable has undergone a deformation such as a lengthening. When the detection apparatus for detecting the anomaly is situated on the intervention installation, the comparison may be performed between detection operation done both when winding or both when unwinding the cable. Indeed, there may be an elastic and reversible lengthening of the cable to be wound because of the weight of the downhole assembly that exerts a tension at the end of the cable and the results may be interpreted more easily by comparing detection operations performed at the same stage of the well intervention.

It may also be monitored with an additional device comprising a marker that marks the cable for instance setting the marks at predetermined positions on the cable, such as every 20 meters. The additional device may also comprise a detector for detecting the marks and associating them with a position on the cable. This may also allow to monitor the lengthening of the cable over time. The marker may be an apparatus for spraying or coating the cable with cobalt and the detector may be a gamma-ray detector able to detect the cobalt.

Additional monitoring may also comprise an optical device, such as a LASER for determining the cross-section of the cable, which may enable to detect local anomalies as well as lengthening of the cable, that may be related to a decrease of the diameter of the cable.

Such monitoring enables to obtain information about the state of the cable and to avoid using the cable for a job if the cable is not able to correctly perform the job, on an electrical and/or mechanical standpoint.

The above-mentioned aspect of the disclosure also comprises a method using measured telemetry signal in order to determine without additional detection apparatus if the cable 32 is damaged.

Figure 14A:
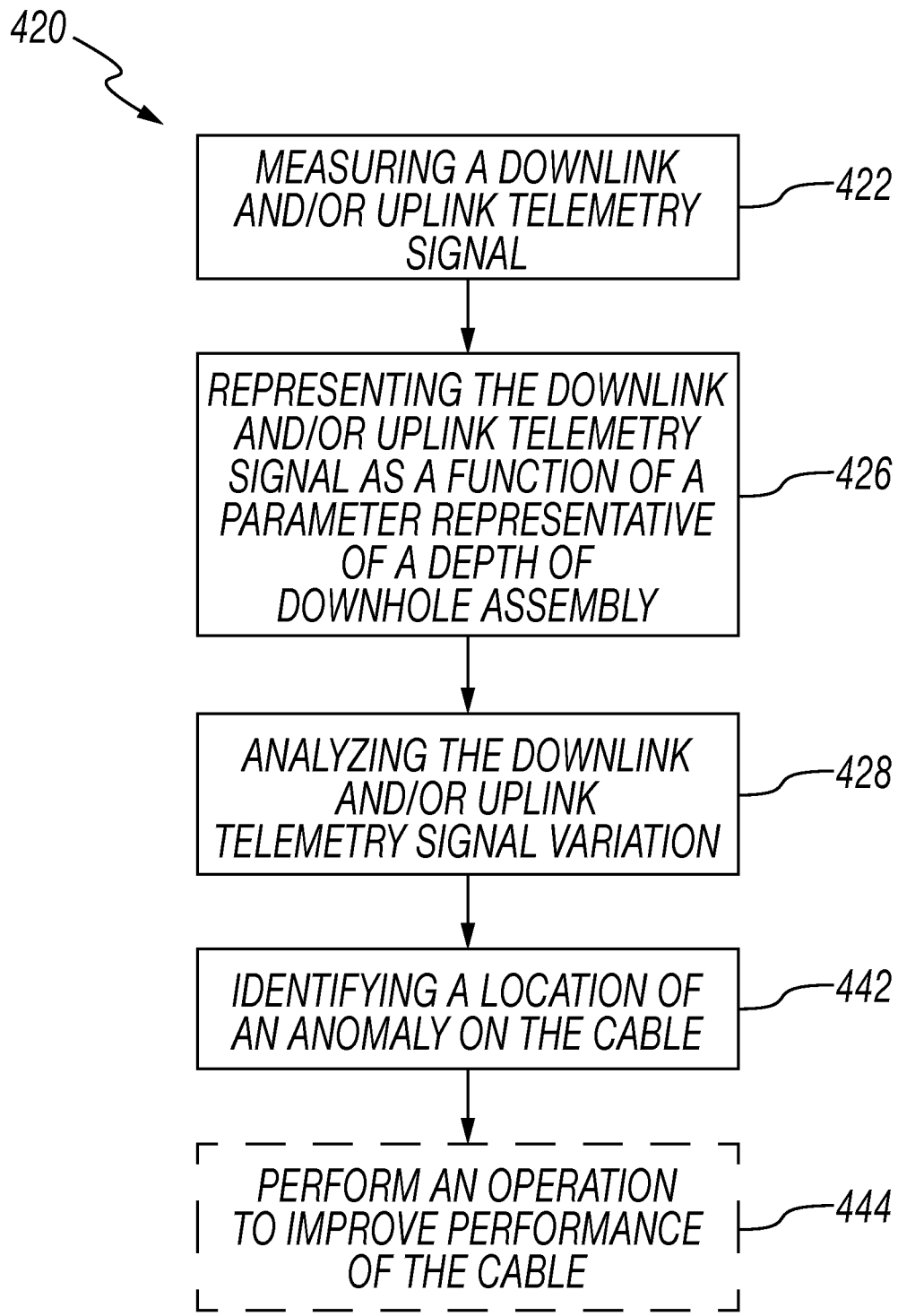
FIGS. 14A &B are flow diagrams of a method for monitoring the performances of the cable according to another embodiment of the disclosure, FIGS. 15A & B are plots of a measured downlink and uplink telemetry signals respectively when a cable is not damaged and when a cable is damaged.

The method 420 is described below with reference to FIGS. 14A & B. The method first comprises measuring (block 422) the downlink telemetry signal (ie signal transmitted from the surface control module to the downhole assembly and measured in the downhole assembly by a downlink sensor) and/or the uplink telemetry signal (ie signal transmitted from the downhole assembly to the surface control module and measured in the surface control module by an uplink sensor) (block 424). For obtaining a digital measurement of the signals, the system may comprise an amplifier, and a analog to digital converter. The method then comprises representing (block 426) the measured downlink telemetry signal and/or uplink telemetry signal as a function of a parameter representative of depth. This operation may include plotting the measured telemetry signals as a function of depth of the downhole assembly. However, it may also include plotting the signals as a function of another parameter such as time. In the example of FIG. 8, the signals are plotted as a function of depth (the uplink telemetry signal is represented at 404 and downlink telemetry signal is represented at 406) and the following plots will be shown as a function of depth. However, on a job, a time-depth profile of the job is obtained and it is possible to convert any signal variation from time to depth. In other words, any signal plotted as a function of time may be converted into a signal plotted as a function of depth in using the time-depth profile of the job. If any other profile linking the depth and a parameter of the job (for instance, pressure) has been obtained, the signal may be plotted as a function of this parameter. The measured telemetry signals comprise at least the signal amplitude. This operation as well as the following operations may be performed by a set of processors comprising at least a processor situated in the downhole assembly and/or at the surface control module and/or remotely from the well site. The set of processors may be, comprise one or more processors of various types operable in the local application environment, and may include one or more general-purpose processors, special-purpose processors, microprocessors, digital signal processors (DSPs), field-programmable gate arrays (FPGAs), application-specific integrated circuits (ASICs), processors based on a multi-core processor architecture, and/or other processors.

Figure 14B:
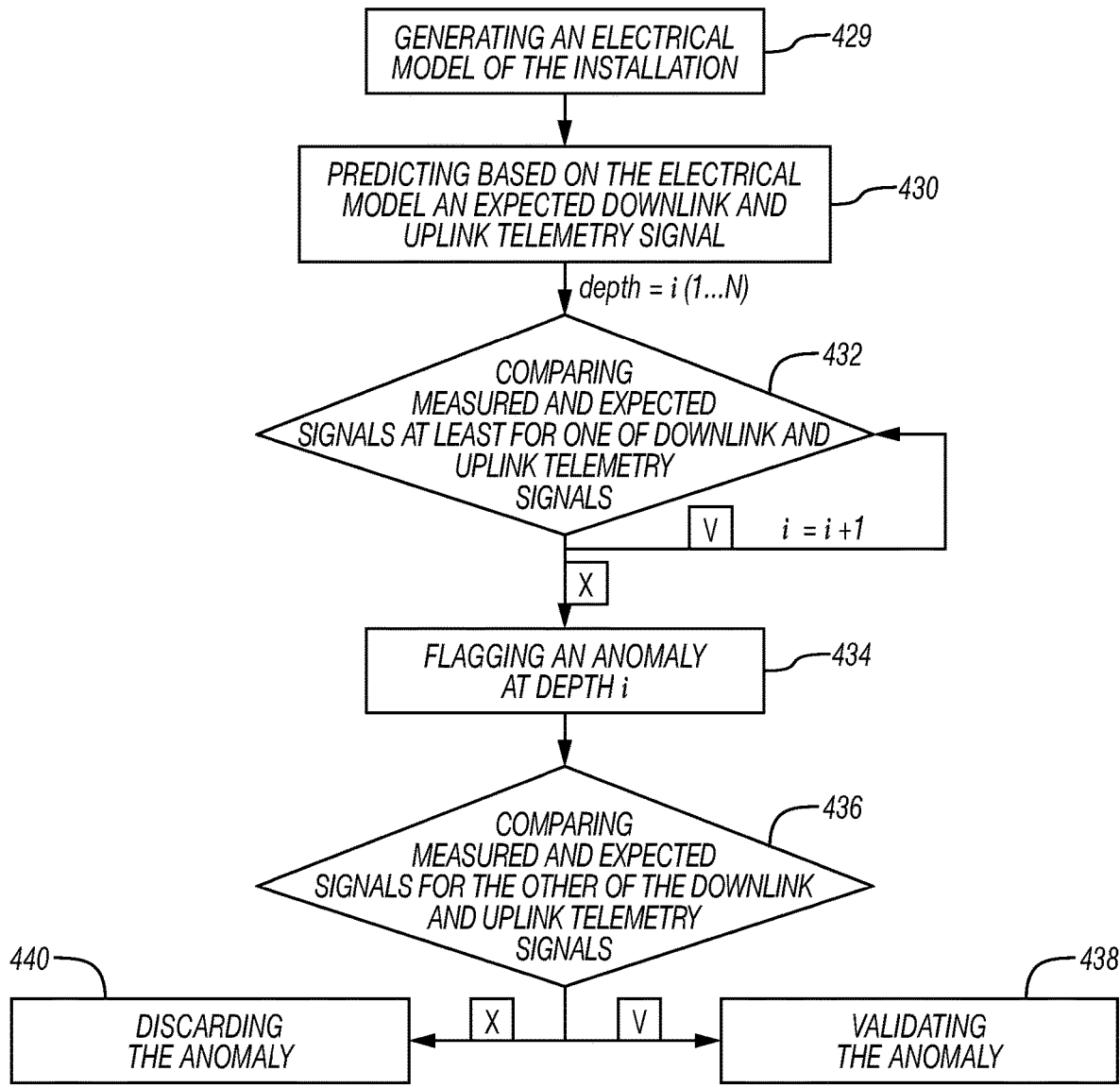

The method also comprises analysing at least one of the downlink and uplink telemetry signal variation in view of an electrical model of the wellbore and optionally of the other of the downlink and uplink telemetry signal (block 428). An embodiment of the analysis operation is represented on FIG. 14B. The analysis may include generating (block 429) an electrical model of an installation comprising the cable in the wellbore when the cable does not comprise any anomaly, and, based on the electrical model, predicting (block 430) an expected downlink telemetry signal and/or uplink telemetry signal. As explained above, the expected signal is predicted as a function of depth but if the measured signal is plotted as a function of time it can be converted into time domain using the time-depth profile of the job. Then, it comprises comparing (block 432) at least one of the measured downlink or uplink telemetry signal to the expected corresponding (ie downlink or uplink) telemetry signal at each depth and flagging (block 434) an anomaly at a particular depth when there is a substantial difference between the expected and measured corresponding signals. Depending the configuration of the installation in the wellbore, in particular the length of the cable that has been unwrapped in the borehole and the number, magnitudes and positions of anomalies in the borehole, the anomalies may be detected based on the downlink and/or uplink telemetry signal. The downlink telemetry signal will enable detection of the anomalies in most of the cases but the uplink telemetry signal may help identifying the anomalies alone or in combination with the downlink telemetry in certain configuration, such as when the anomaly is close to the surface and the cable has been almost entirely unwrapped in the wellbore.

At block 432, depending on the configuration of the installation, only one appropriate signal may be analysed. However, in another embodiment, both uplink and downlink telemetre are permanently analysed in order to identify the anomalies.

In an embodiment of the disclosure, comparing the measured and expected signals corresponds to locating a stepdown of the telemetry signal, ie a decrease of the signal that is sudden and stable once it has occurred. The criteria for evaluating the stepdown are for instance a decrease of the measured signal of at least 3 dB/meter and after the decrease, a stability of the decreased signal (+/−10%) for a certain length of the cable, for instance at least 10 meters. However any other appropriate criteria may be taken into account.

The downlink, respectively uplink, telemetry variation may also be analysed in view of the uplink, respectively downlink, telemetry signal. In particular, both expected uplink and downlink telemetry signals may be predicted (block 430) based on the electrical model and, if an anomaly has been flagged at a particular depth for one of the downlink and uplink telemetry signals (for instance downlink), the expected and measured telemetry signal are compared (block 436) for the other of the downlink and uplink telemetry signals (for instance uplink). This comparison generally comprises verifying the behaviour of the other of the downlink and uplink telemetry at the particular depth where a potential anomaly on the cable was flagged based on the one of the downlink and uplink telemetry signals. Based on the behaviour of the other signal, the anomaly is validated (block 438) or discarded (block 440). As the electrical model of the cable (FIG. 7) is not symmetrical from surface to downhole and from downhole to surface, the uplink telemetry and the downlink telemetry are indeed not always affected identically by damages on the cable. However, if the other signal remains stable or also encounters a stepdown as defined above at the particular depth, the presence of the anomaly on the cable is confirmed. Using both signals to detect location of the anomaly therefore avoiding false positive and enable better characterization of the anomaly.

Figure 15A:
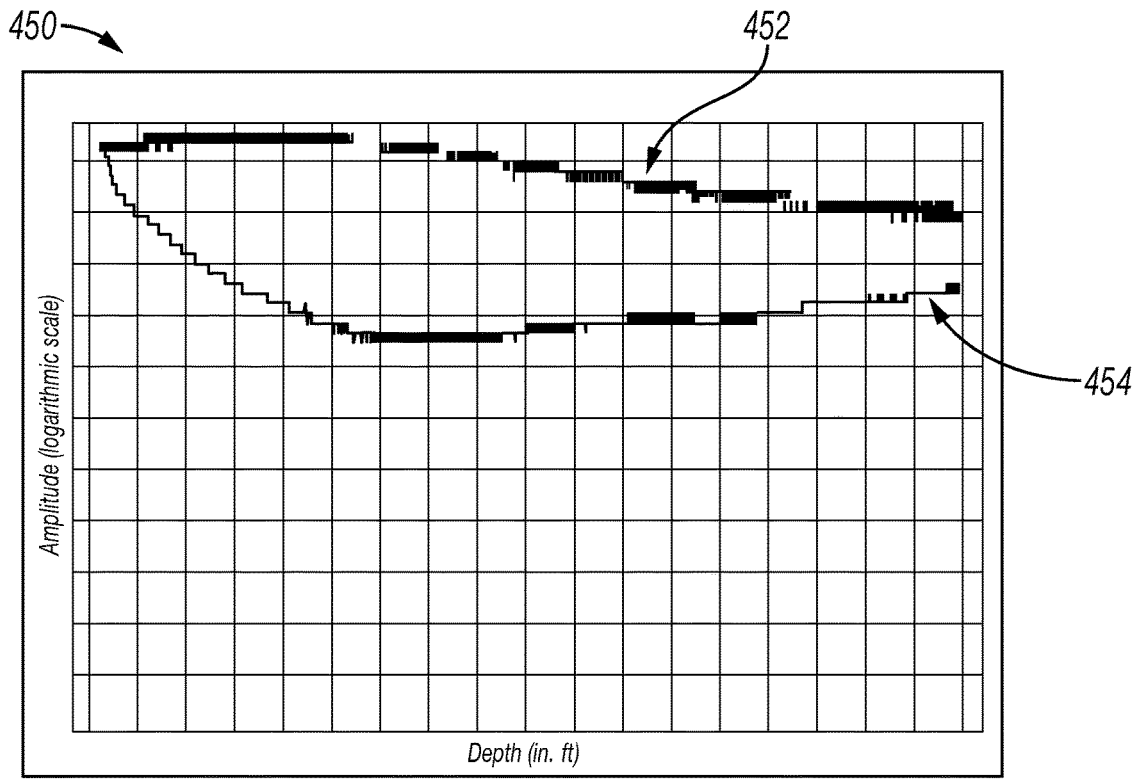
Figure 15B:
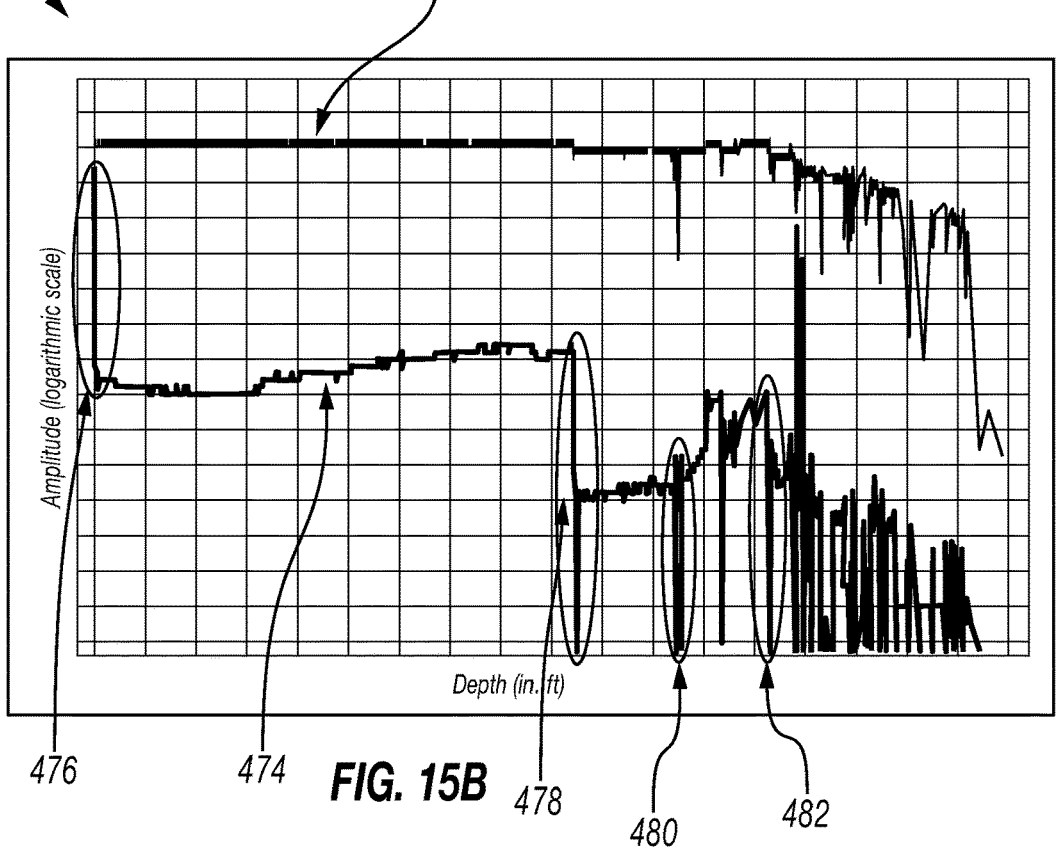

This can be understood more easily based on FIGS. 15A & B that shows plots 450, 470 of the uplink and downlink telemetry signals as a function of depth of the downhole assembly, respectively for a perfect cable on plot 450 of FIG. 15A and for a cable comprising anomalies on plot 470 of FIG. 15B. On the plot 450, the standard telemetry signals are shown. In this example, it can be seen that when the depth of the downhole assembly increases, the downlink telemetry signal first slowly decreases while uplink telemetry signal remains essentially constant. Then, the uplink telemetry signal decreases and the downlink telemetry signal remains constant and even slightly increases; this is also explained by the fact the electrical model of the cable is not symmetrical from surface to downhole and from downhole to surface. On the plot 470, when the cable comprises anomalies, the downlink telemetry signal steps down at several depths, namely depths 476, 478, 480 and 482 for instance. As described earlier, contrary to the decrease of plot 450, the stepdown is sudden and in conformity with predetermined criteria, such as the ones listed above. However, it can be seen that whereas the uplink telemetry signal remains essentially constant at depths 476 and depths 478, both signals are unstable at depths 480 and 482. Therefore, only the depths 476 & 478 will be flagged for determining a location of an anomaly on the cable. At depths 480 & 482 it will be considered that the signal is perturbated by other elements of the environment of the installation, such as loss of electrical contact between the tool housing and the tubing that can due to a too high tool speed while moving in the well or an insulated deposit in the internal part of the tubing.

Once the analysis has been performed, the method then comprises identifying (block 442) a location of an anomaly on the cable, which corresponds to a distance from the extremity of the cable that is in the wellbore equal to the flagged depth. Indeed, the anomaly shall have an influence on the telemetry signal as soon as it penetrates into the wellbore, assuming the wellbore fluid conductivity is not zero. Therefore, the depth of the downhole assembly at which the anomaly was first detected corresponds to the depth at which the anomaly has entered the wellbore fluid (assuming the wellbore fluid conductivity is not zero), hence the depth at which the anomaly was detected corresponds to the distance between the extremity of the cable and the anomaly.

Then, an operation may be performed to improve performance of the cable (block 444). Such operation may comprise one or more of the following:

Suppressing the anomaly from the cable, for instance by repairing the cable or cutting a portion of the cable comprising the anomalies, Predicting the uplink and downlink telemetry signal for the current job or a next job with the damaged cable.

As explained above, predicting uplink and/or downlink telemetry signal for the current or next job with the damaged cable may comprises defining an electrical circuit for each of the anomaly (as explained in relationship with FIG. 7 for instance) and determining the parameters of the electrical circuit based on the downlink telemetry signal that has been measured. This may also enable to determine the magnitude of the anomaly as explained above, in particular if the characteristics of the downhole fluid are well known. Once the magnitude of the anomaly has been defined, a model of the installation comprising the cables with the anomalies, in the configuration corresponding to the final configuration of the current or next job may be set up. Based on this model, it is possible to determine if the job will be successful and possibly to take a decision concerning the job. For instance, the current job may be stopped before reaching the target depth because it has been detected that the communication at such depth will not be functional. This saves a tremendous amount of non-productive time.

Thus, the method according to this embodiment of the disclosure enables to detect at least the location of the anomalies on the cable based on downlink and/or uplink telemetry measurement. This does not require any additional detection apparatus and may give critical information to avoid failure of the current or a subsequent job. The accuracy of such method is inferior to the accuracy of the detection apparatus but it enables to obtain an estimation of the performance of the cable without any specific material. This method will be efficient in particular when the downhole fluid is a conductive fluid such as a water-based mud or brine or even an oil-based mud including conductive additives. It can be performed in real-time if the downhole assembly is able to send the measurement uphole or when the tool is retrieved from the wellbore after a job, when the measurements have been stored in the downhole assembly.

Another aspect of the disclosure is to prevent the cable from being damaged so that the number of jobs it performs may significantly increase. It has been demonstrated that the cable was mainly damaged during the winding and unwinding and that an optimal distribution of the cable on the drum ensure less damages on the cable while winding and unwinding.

Spooling sleeves for fitting around drums comprising grooves for guiding the first layer of the cable on the drum already exist and improve the spooling operation. Manufacturing dimensional uncertainties of the drum and sleeve may create gaps between the sleeve and flanges of the drum leading to difficulties to perform the spooling correctly.

The disclosure also relates to spooling sleeves. As previously disclosed, spooling sleeves 500, 600, 700 have a generally cylindrical shape and are configured to fit around a spooling drum. They may be made of a flexible material and may be made of two half-cylinders 502, 504; 602, 604; 702, 704 cut according to a surface P containing the axis of the cylinder. The half cylinders may also be rotatably mounted relative to each other via an axis parallel to the axis of the cylinder between a first position in which they are at least partly separated to receive the drum between the half-cylinders and a second position in which the half-cylinders are closed around the drum so that an internal surface of the sleeve tightly fit the external surface of the drum (not represented on the drawings).

Figure 9:
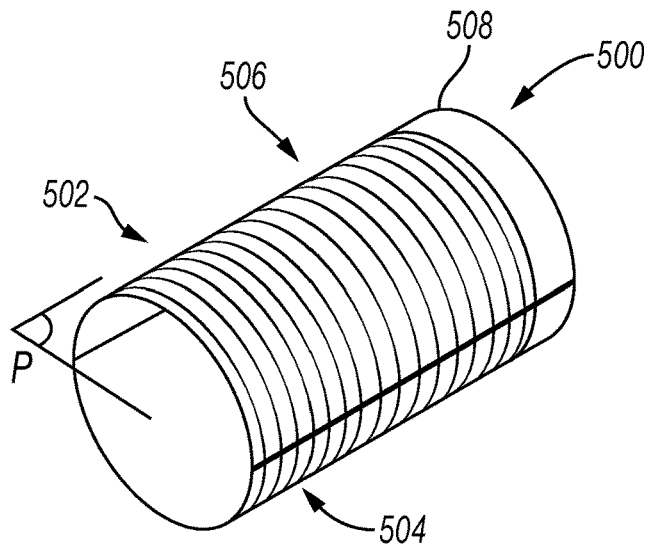
FIG. 9 is a representation in perspective of a first embodiment of a spooling sleeve according to the disclosure.

The first spooling sleeve 500 according to the disclosure is shown on FIG. 9 and comprises a first portion 506 comprising helical grooves 507 extending around the periphery of the drum. The grooves 507 may be arranged as disclosed in U.S. Pat. No. 3,391,443 or in any appropriate manner. The first portion 506 extends on at least 80%, in particular 90%, of the peripheral surface of the sleeve.

Figure 10:
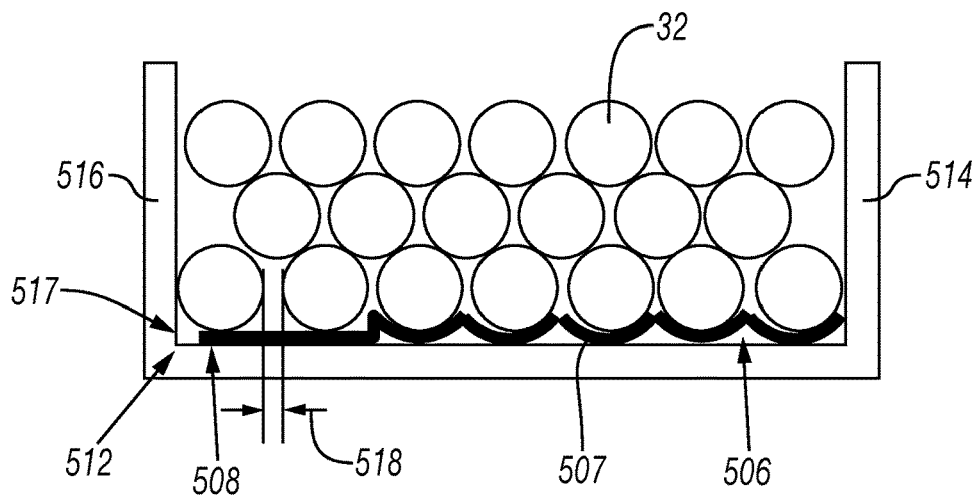
FIG. 10 is a sectional view of a part of the spooling sleeve of FIG. 9 situated on a spooling drum.

It also comprises a second portion 508 situated at one longitudinal end of the sleeve and devoid of grooves. This second portion enables to handle the manufacturing dimensional uncertainties. Indeed, as shown on FIG. 10, representative of the sleeve fitted on a drum 512 comprising flanges 514, 516 at both of its longitudinal ends, due to such manufacturing dimensional uncertainties, the drum may be slightly longer than expected which may create a gap 517 between the flange and the sleeve and then the last turn of cable that may endanger the spooling of the cable 32. As the second portion is devoid of grooves, it enables to handle more freedom in the positioning of the cable in this portion and to handle such gap by positioning it between two turns of cable (as shown at 518) and also optionally to distribute the gap between different turns of cable 32, for instance between the first and second turn, and the second and third turn, which has not been shown in FIG. 10.

Figure 11:
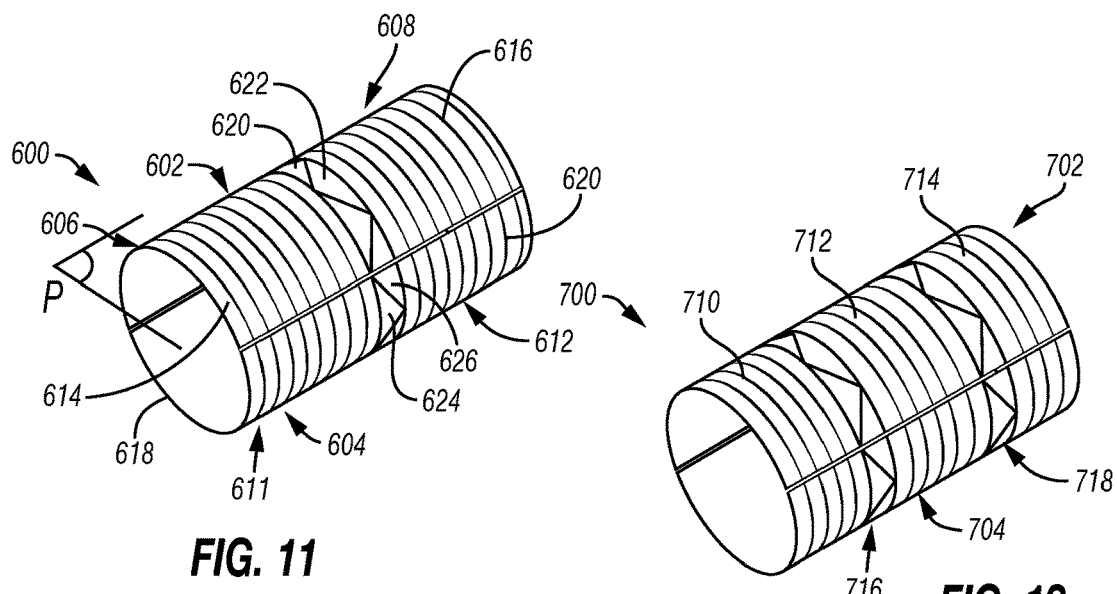
FIG. 11 is a representation in perspective of a second embodiment of a spooling sleeve according to the disclosure.

A second spooling sleeve as shown on FIG. 11 also comprises two half-cylinders 602, 604, but each of this half-cylinders comprises two independent parts 606, 608; 610, 612, having each a half-cylinder shape as well. The parts 606, 608 and 610, 612 have complementary shapes in order to respectively form half-cylinders 602, 604.

Each part comprises a first portion 614, 616, 618, 620 situated at a first longitudinal end of the part forming as well a longitudinal end of the sleeve and comprising peripheral grooves for spooling the cable 32 around the drum as already in reference to the first spooling sleeve 500.

Each part also comprises a second portion devoid of grooves, respectively 620, 622, 624, 626. These portions are situated at a second longitudinal end of the part 606, 608, 610, 612 and form together a zone of the sleeve situated in the center of the sleeve once assembled, relative to the longitudinal axis, so that it is situated between the first portions 606, 610 on one side of the sleeve and first portions 608, 612 on the other side of the sleeve.

The longitudinal attachment edges of each of the second portions 620, 622 and 624, 626 are of complementary shape. Their edge 626, 628 is cut in a specific pattern, such as a zigzag pattern as shown on FIG. 11. This pattern is chosen so that the length of the edge portions having a tangent situated in a predetermined plan perpendicular to the axis of the cylinder are less than 20% of the perimeter of the sleeve. A sinusoidal pattern, a rectilinear pattern tilted relative to the plan perpendicular to the axis of the sleeve or a stepping patterns having different plateau in different plans, the total length of the plateaux situated in one predetermined plan not exceeding 20% of the perimeter of the sleeve, may also be chosen.

As the previous one, such sleeve enables to handle the manufacturing dimensional uncertainties of the drum 512. These uncertainties may generate a gap 630 between the edges 626, 628 of the parts 606, 608, as show on FIG. 12. But as the pattern of the edges is chosen so that edge portions having a tangent situated in a predetermined plan perpendicular to the axis of the cylinder are less than 20% of the perimeter of the sleeve, the gap has the same shape and the cable does not get stuck in the gap even if its dimension in the axial direction of the sleeve is of the same order as the diameter of the cable.

Further, this sleeve enables to position correctly the cable 32 next to the flanges 514, 516 of the drum 512, as grooves 617 guiding the cable 32 are present at both ends of the sleeve. In the central zone of the sleeve, made of the adjacent second portions 620, 622 and 624, 626, the freedom to position the cable 32 is greater and the gap due to manufacture dimensional uncertainties may be distributed between the cable turns surrounding the second portion as shown at 632, which may ensure a correct spooling of the subsequent layers even taking into account the manufacturing uncertainties. This distribution may be performed, for instance manually, after the first spooling of the first layer of the cable 32 around the drum.

Figure 13:
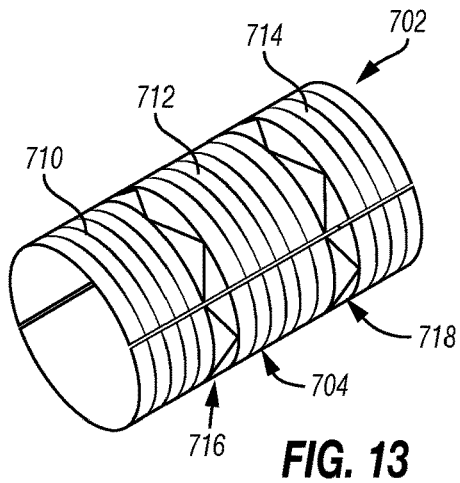
FIG. 13 is a representation in perspective of a variant of the second embodiment of a spooling sleeve according to FIG. 11.
Figure 12:
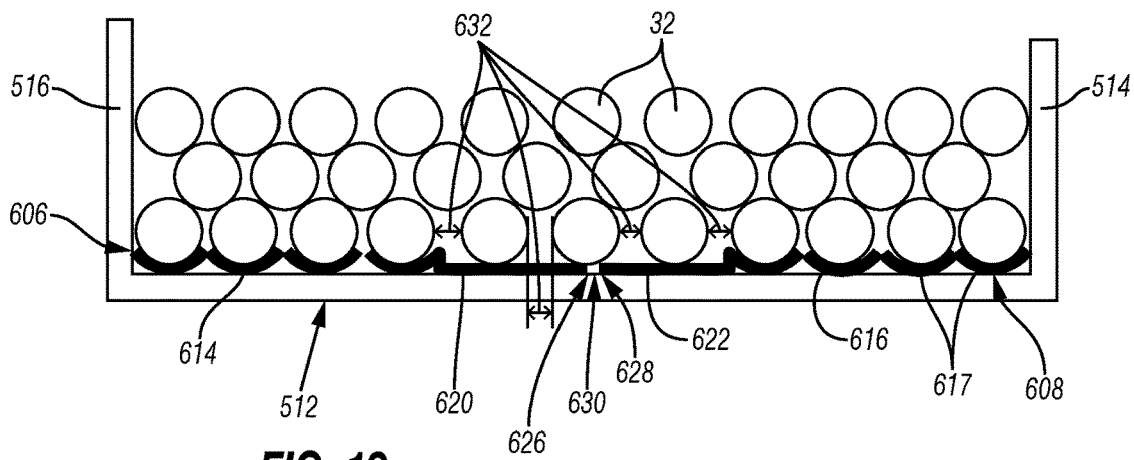
FIG. 12 is a sectional view of a part of the spooling sleeve of FIG. 11 situated on a spooling drum.

As shown on FIG. 13, each half cylinder 702, 704 of the sleeve 700 may not be made of two independent parts but for instance of three independent parts 710, 712, 714, so as the sleeve comprise two distinct central zones devoid of groove 716, 718 instead of one. It may also comprise any number of independent parts. The edges of the second portions of each of the parts are however cut in a zigzag pattern as explained above. It enables to further distribute the gap due to the dimensional uncertainties in two zones of the sleeve and to decrease the dimensional of each of the gaps.

The percentage of the periphery of the sleeve being devoid of grooves may be inferior to 50%, more particularly to 20%.

In view of the entirety of the present disclosure, including the figures, a person skilled in the art should appreciate that they may readily use the present disclosure as a basis for designing or modifying other processes and structures for carrying out the same uses and/or achieving the same aspects introduced herein. A person skilled in the art should also realize that such equivalent constructions do not depart from the spirit and scope of the present disclosure, and that they may make various changes, substitutions and alterations herein without departing from the spirit and scope of the present disclosure. For example, although the preceding description has been described herein with reference to particular means, materials and embodiments, it is not intended to be limited to the particulars disclosed herein; rather, it extends to functionally equivalent structures, methods, and uses, such as are within the scope of the appended claims.

The disclosure relates in particular to a method for monitoring the performances of a cable for carrying a downhole assembly in a wellbore, the cable comprising at least a conductive core and an insulating outer layer, the method comprising measuring at least one of a downlink telemetry signal, transmitted from a surface control module to the downhole assembly, and an uplink telemetry signal, transmitted from the downhole assembly to the surface control module; representing at least one of the downlink and uplink telemetry signals as a function of a parameter representative of a depth of the downhole assembly; analyzing a variation of the at least one of the downlink and uplink telemetry signal as a function of the parameter representative of depth in view of an electrical model of an installation including the cable and the downhole assembly disposed in the wellbore, and determining a location of one or more anomalies of the cable based on the analysis.

The method may comprise determining a magnitude of at least an anomaly based on the analysis.

The electrical model of the installation may model an electrical circuit corresponding to the installation when the cable does not comprise any anomaly, and wherein the method comprises predicting an expected telemetry signal based on the electrical model and comparing the measured telemetry signal and the expected telemetry signal. In an embodiment, an anomaly may be detected when there is a substantial difference between the measured telemetry signal and the expected telemetry signal at least at a particular depth.

The electrical model may be defined in function of at least a property of a fluid present in the wellbore in the predetermined configuration of the installation.

The method may comprise determining a magnitude of at least an anomaly based on the analysis, wherein determining the magnitude comprises defining an electrical circuit corresponding to an anomaly and determining parameters of the electrical circuit in view of at least one of the measured downlink telemetry signal.

The method may also comprise measuring the uplink and downlink telemetry signals and performing the analysis of the variations of at least one of the uplink and downlink telemetry signals based on the electrical model and on the other of the uplink and downlink telemetry signals.

Analyzing the measured telemetry signal variation may include detecting a stepdown of the telemetry signal variation at a particular value of the parameter representative of depth.

The method may further comprise one or more of the following operations: suppressing the detected anomaly of the cable, predicting the at least one of the uplink and downlink telemetry signals in the current or a next job taking into account the parameters of the corresponding job and of the anomalies.

If applicable, suppressing the detected anomaly of the cable comprises one or more of repairing the anomaly and cutting the extremity of the cable comprising the anomaly.

If applicable, predicting the downlink or uplink telemetry signal in the current or next job includes generating an electrical model of an installation comprising the cable and its anomalies in a wellbore having a configuration corresponding to the configuration of the corresponding job. The one or more parameters of the job include for instance depth of the job, type of fluid in the wellbore, location and magnitude of the anomalies of the cable.

The downlink telemetry signal may be measured by the downhole assembly while the uplink telemetry signal is measured by the surface control module.

Measuring the downlink or uplink telemetry signal comprises at least measuring the amplitude of the corresponding signal.

The disclosure also relates to a system for monitoring the performances of a cable for carrying a downhole assembly in a wellbore and comprising at least a conductive core and an insulating outer layer, the system comprising at least one of a downlink sensor for measuring a downlink telemetry signal at the downhole assembly, wherein the downlink telemetry signal is a signal transmitted from a surface control module to the downhole assembly, and an uplink sensor for measuring an uplink telemetry signal at the surface control module, wherein the uplink telemetry signal is a signal transmitted from the downhole assembly to the surface control module. The system also comprises a processor configured for representing at least one of the downlink and uplink telemetry signals received from the downlink or uplink sensor as a function of a parameter representative of a depth of the downhole assembly, analyzing a variation of the at least one of the downlink and uplink telemetry signals in view of an electrical model of an installation including the cable and the downhole assembly disposed in the wellbore, and determining a location of one or more anomalies of the cable based on the analysis.

In an embodiment, the system comprises the uplink and downlink sensors and the processor is configured for analyzing the variations of one of the uplink and downlink telemetry signals based on the electrical model and on the other of the uplink and downlink telemetry signals.

The disclosure relates also to a method for monitoring the performances of a cable for carrying a downhole assembly in a wellbore, the cable comprising at least a conductive core and an insulating outer layer, the method comprising:
  Performing on at least a portion of the cable a detection operation for detecting the presence of at least a local anomaly on the cable;
  Generating an electrical model of a predetermined configuration of an installation including the cable and the downhole assembly disposed in the wellbore, the model being defined in function of the detected local anomalies,
  Estimating a parameter relative to a signal transmitted by the cable between the downhole assembly and a surface equipment in the predetermined configuration on the basis of the electrical model.

The parameter relative to a signal transmitted may be the signal transmitted itself or a signal lost between the surface and the downhole assembly.

The detection operation may be performed while lowering and/or removing the downhole assembly from the wellbore.

Performing the detection operation may then comprise passing the portion of the cable by a detection apparatus while lowering and/or removing the downhole assembly from the wellbore In this case, while performing a job, the data for estimating a later job may be gathered. It may also be performed outside of an intervention installation.

In one embodiment, the detection apparatus comprises a conductive element in contact with the cable, performing the detection operation comprising applying a voltage difference between the element and the cable and measuring an electrical parameter relative to the element. For instance, the conductive element is a box filled with a conductive medium, and performing the detection operation comprises applying a voltage difference between the box and the cable and measuring an electrical parameter relative to the box. The conductive medium may be a conductive fluid or a plurality of conductive elements such as balls. The box may be insulated from the formation. Similarly, the conductive element may be a brush having metallic bristles contacting the cable.

In another embodiment, the detection apparatus comprises at least two pressurized sealing rings for surrounding the cable, and performing the detection operation comprises measuring a pressure differential between the sealing rings. This detection apparatus may be situated in particular in the stuffing box as the stuffing box comprises sealing elements for insulating the wellbore from the surface.

In another embodiment, the detection apparatus may comprise at least an infrared sensor for detecting the infrared emission of the cable. It may additionally comprise a heater situated upstream from the infrared sensor.

The method may be performed with data coming from one or several detection apparatuses. Further, any detection apparatus enabling to detect an anomaly, such as a dimensional measurement apparatus, for instance LASER, may be used for performing the method.

The method may also comprise associating the anomaly with a position on the cable.

It may also comprise performing a first detection operation at a first time and a second detection operation at a later time, comparing the results of the first and second detection operation and determining a parameter relative to the length of the cable on the basis of the comparison. This parameter may be an elastic or plastic deformation of the cable.

Performing the detection operation may also comprise determining a magnitude of an anomaly. An anomaly may be a hole or a crack in the insulation layer or coating of the cable and the magnitude is related to the dimension of the anomaly and in particular to how it affects the signal transmitted from the surface equipment to the downhole assembly.

The electrical model of the predetermined configuration of the installation is designated wellbore electrical model, and wherein performing the detection operation comprises generating an electrical model of the detection apparatus, designated anomaly electrical model, and estimating electrical characteristics of an first electrical circuit modelling the local anomaly, wherein generating the wellbore electrical model comprises modelling the anomaly with a second electrical circuit having electrical characteristics determined on the basis of the electrical characteristics of the first electrical circuit. The electrical characteristics may be impedance, capacitance or inductance of the components of the electrical circuit modelling the anomaly. The electrical circuit may be in particular a RC circuit, ie a resistor and a capacitor in parallel.

In an embodiment, first and second electrical circuits may have same identical characteristics.

In another embodiment, the wellbore electrical model is defined in function of at least a property of a fluid present in the wellbore in the predetermined configuration of the installation. In particular, the electrical characteristics of the second electrical circuit are determined based on the electrical characteristics of the first circuit and on the property of the fluid. The considered property of the fluid may be the resistivity.

The method may also comprise calibrating the detection apparatus by measuring an electrical parameter relative to the element, in particular the box, when a predetermined sample is in the detection apparatus, wherein performing the detection operation comprises normalizing the measured electrical parameter relative to a reference detection apparatus. The reference detection apparatus may for instance be filled with a reference fluid.

The cable may be a wireline cable or a slickline cable.

The method comprises predicting, on the basis of parameter relative to the transmitted signal, a potential failure of the cable in the predetermined configuration of the installation.

The method comprises recommending an optimized configuration of the cable when the failure of the cable is predicted. The optimized configuration may be determined based on the parameter relative to the transmitted signal and on the length of the cable.

The method comprises monitoring a dimensional parameter of the cable (via LASER, cobalt marking) on the portion of the cable in addition and predicting the cable failure on the basis of the dimensional parameter as well.

The disclosure relates to a system for monitoring the performances of a cable for carrying a downhole assembly in a wellbore and comprising at least a conductive core and an insulating outer layer, the system comprising:
  a detection apparatus for detecting the presence of at least a local anomaly on the cable;
  a processor for:
    i. Generating an electrical model of a predetermined configuration of an installation including the cable and the downhole assembly disposed in the wellbore, the model being defined in function of the detected local anomalies,
    ii. Determining a parameter relative to the signal transmitted by the cable between the downhole assembly and a surface equipment of the installation in the predetermined configuration on the basis of the electrical model.

The system may comprise a device for lowering the downhole assembly in the wellbore and/or removing the downhole assembly from the wellbore, configured so that the cable passes by the detection apparatus when the downhole assembly is lowered and/or removed from the well.

The detection apparatus may be installed in a stuffing box of the system for lowering and/or removing the downhole assembly.

The disclosure also relates to a sleeve for spooling a cable around a drum, having an essentially cylindrical shape of a predetermined axis and configured to be disposed around a spooling surface of the drum, the sleeve comprising at least two independent parts, each part forming at least a fraction of an essentially cylindrical shape and having at least:
  A first portion, comprising at least a peripheral groove to receive the cable,
  A second portion situated at least at one of the longitudinal ends of the part and having a longitudinal attachment edge, wherein the attachment edges are configured so that a longitudinal attachment edge of a first part is of complementary shape of a longitudinal attachment edge of a second part, wherein the attachment edges comprise at least an edge portion, and are each configured so that the total length of the edge portions having a tangent situated in a predetermined plan perpendicular to the axis of the cylinder are less than 20% of the perimeter of the sleeve.

The parts may be arranged so that the sleeve comprise in the longitudinal direction a first zone at each of its end, and at least a central zone being formed by two adjacent second portions of the first and second parts of the sleeve.

The attachment edges may have:
A zigzag shape,
A sinusoidal shape,
A rectilinear shape tilted in a plan having a normal line tilted relative to the axis of the sleeve.

The attachment edges may have:
A zigzag shape
A sinusoidal shape
A rectilinear shape tilted in a plan having a normal line tilted relative to the axis of the sleeve)

The invention claimed is:

1. A method for monitoring the performances of a cable for carrying a downhole assembly in a wellbore, the cable comprising at least a conductive core and an insulating outer layer, the method comprising:
measuring at least one of a downlink telemetry signal, transmitted from a surface control module to the downhole assembly, and an uplink telemetry signal, transmitted from the downhole assembly to the surface control module;
representing at least one of the downlink and uplink telemetry signals as a function of a parameter representative of a depth of the downhole assembly,
analyzing a variation of the at least one of the downlink and uplink telemetry signal as a function of the parameter representative of depth in view of an electrical model of an installation including the cable and the downhole assembly disposed in the wellbore,
determining a location of one or more anomalies of the cable based on the analysis.

2. The method according to claim 1, comprising determining a magnitude of at least an anomaly based on the analysis.

3. The method according to claim 1, wherein the electrical model of the installation models an electrical circuit corresponding to the installation when the cable does not comprise any anomaly, and wherein the method comprises predicting an expected telemetry signal based on the electrical model and comparing the measured telemetry signal and the expected telemetry signal.

4. The method of claim 3, wherein an anomaly is detected when there is a substantial difference between the measured telemetry signal and the expected telemetry signal at least at a particular depth.

5. The method according to claim 1, wherein the electrical model is defined in function of at least a property of a fluid present in the wellbore in the predetermined configuration of the installation.

6. The method of claim 3, comprising determining a magnitude of at least an anomaly based on the analysis, wherein determining the magnitude comprises defining an electrical circuit corresponding to an anomaly and determining parameters of the electrical circuit in view of at least one of the measured downlink telemetry signal.

7. The method of claim 1, comprising measuring the uplink and downlink telemetry signals and performing the analysis of the variations of at least one of the uplink and downlink telemetry signals based on the electrical model and on the other of the uplink and downlink telemetry signals.

8. The method of claim 1, wherein analyzing the measured telemetry signal variation include detecting a stepdown of the telemetry signal variation at a particular value of the parameter representative of depth.

9. The method of claim 1, further comprising one or more of the following operations:
suppressing the detected anomaly of the cable,
predicting the at least one of the uplink and downlink telemetry signals in the current or a next job taking into account the parameters of the corresponding job and of the anomalies.

10. The method of claim 9, wherein suppressing the detected anomaly of the cable comprises one or more of repairing the anomaly and cutting the extremity of the cable comprising the anomaly.

11. The method of claim 9, wherein predicting the downlink or uplink telemetry signal in the current or next job includes generating an electrical model of an installation comprising the cable and its anomalies in a wellbore having a configuration corresponding to the configuration of the corresponding job.

12. The method according to claim 11, wherein the one or more parameters of the job include depth of the job, type of fluid in the wellbore, location and magnitude of the anomalies of the cable.

13. The method according to claim 1, wherein the downlink telemetry signal is measured by the downhole assembly while the uplink telemetry signal is measured by the surface control module.

14. The method according to claim 1, wherein measuring the downlink or uplink telemetry signal comprises at least measuring the amplitude of the corresponding signal.

15. A system for monitoring the performances of a cable for carrying a downhole assembly in a wellbore and comprising at least a conductive core and an insulating outer layer, the system comprising:
at least one of:
i. a downlink sensor for measuring a downlink telemetry signal at the downhole assembly, wherein the downlink telemetry signal is a signal transmitted from a surface control module to the downhole assembly,
ii. an uplink sensor for measuring an uplink telemetry signal at the surface control module, wherein the uplink telemetry signal is a signal transmitted from the downhole assembly to the surface control module,
a processor configured for:
i. Representing at least one of the downlink and uplink telemetry signals received from the downlink or uplink sensor as a function of a parameter representative of a depth of the downhole assembly,
ii. analyzing a variation of the at least one of the downlink and uplink telemetry signals in view of an electrical model of an installation including the cable and the downhole assembly disposed in the wellbore,
iii. determining a location of one or more anomalies of the cable based on the analysis.

16. The system of claim 15, comprising the uplink and downlink sensors wherein the processor is configured for analyzing the variations of one of the uplink and downlink telemetry signals based on the electrical model and on the other of the uplink and downlink telemetry signals.

* * * * *